(12) United States Patent
Yang

(10) Patent No.: US 11,704,508 B2
(45) Date of Patent: Jul. 18, 2023

(54) ELECTRONIC DEVICE

(71) Applicant: HUAWEI TECHNOLOGIES CO., LTD., Guangdong (CN)

(72) Inventor: Jiangtao Yang, Shanghai (CN)

(73) Assignee: HUAWEI TECHNOLOGIES CO., LTD., Shenzhen (CN)

(*) Notice: Subject to any disclaimer, the term of this patent is extended or adjusted under 35 U.S.C. 154(b) by 0 days.

(21) Appl. No.: 17/876,743

(22) Filed: Jul. 29, 2022

(65) Prior Publication Data

US 2022/0366159 A1    Nov. 17, 2022

Related U.S. Application Data

(63) Continuation of application No. 16/966,891, filed as application No. PCT/CN2018/074994 on Feb. 1, 2018, now Pat. No. 11,416,691.

(51) Int. Cl.
  *G06K 7/00* (2006.01)

(52) U.S. Cl.
  CPC ................. *G06K 7/0056* (2013.01)

(58) Field of Classification Search
  CPC .. G06K 7/0056; G06K 7/0013; G06K 7/0052; G06K 19/07732; G06K 19/07743; G01R 31/52; G01R 31/68; G01R 31/66; H04M 1/72403; H04M 1/24; H04B 1/3818; H04B 1/3816
  See application file for complete search history.

(56) References Cited

U.S. PATENT DOCUMENTS

| | | | |
|---|---|---|---|
| 6,557,761 B1 | 5/2003 | Oya et al. | |
| 9,882,327 B2 | 1/2018 | Han et al. | |
| 11,416,691 B2 | 8/2022 | Yang | |
| 2004/0089717 A1* | 5/2004 | Harari | G06K 19/077 235/441 |
| 2004/0177215 A1 | 9/2004 | Nagamasa et al. | |

(Continued)

FOREIGN PATENT DOCUMENTS

| | | |
|---|---|---|
| CN | 2722469 Y | 8/2005 |
| CN | 101276429 A | 10/2008 |

(Continued)

OTHER PUBLICATIONS

Office Action issued in EP18903996.9, dated Feb. 22, 2022, 5 pages.

(Continued)

*Primary Examiner* — Tuyen K Vo

(57) ABSTRACT

An electronic device includes a card interface and a processing module. The card interface is electrically connected to the processing module, and a SIM card or a memory card may be inserted into the card interface. The card interface includes N springs, where N>1; when a memory card is inserted into the card interface, the memory card is electrically connected to the processing module; and when a SIM card is inserted into the card interface, the SIM card is electrically connected to the processing module, and one metal pin of the SIM card is electrically connected to a first spring in the N springs and one spring adjacent to the first spring. The processing module is configured to determine, based on at least a level of the first spring, whether an inserted card is a SIM card or a memory card.

20 Claims, 11 Drawing Sheets

(56) References Cited

U.S. PATENT DOCUMENTS

| | | |
|---|---|---|
| 2004/0210715 A1 | 10/2004 | Harari et al. |
| 2004/0215996 A1 | 10/2004 | Kanamori et al. |
| 2005/0094463 A1 | 5/2005 | Nishizawa et al. |
| 2005/0096087 A1 | 5/2005 | Kim |
| 2005/0279838 A1 | 12/2005 | Wang et al. |
| 2007/0158439 A1* | 7/2007 | Conner ............... G06K 19/07 235/441 |
| 2008/0067255 A1 | 3/2008 | Harari et al. |
| 2008/0147950 A1 | 6/2008 | Chen |
| 2012/0298760 A1* | 11/2012 | Li ........................ H04M 1/675 235/492 |
| 2013/0294602 A1* | 11/2013 | Huxham ............... H04W 12/06 380/255 |
| 2014/0099805 A1 | 4/2014 | Kutchery et al. |
| 2014/0149613 A1 | 5/2014 | Coureau et al. |
| 2014/0273646 A1 | 9/2014 | Yun |
| 2015/0093938 A1 | 4/2015 | Tang et al. |
| 2015/0111413 A1 | 4/2015 | Jiang |
| 2015/0248265 A1 | 9/2015 | Kang et al. |
| 2015/0248365 A1 | 9/2015 | Cheng et al. |
| 2015/0373530 A1 | 12/2015 | Stein |
| 2016/0135048 A1* | 5/2016 | Huxham ............. H04L 63/0442 455/411 |
| 2017/0148492 A1 | 5/2017 | Han et al. |
| 2017/0359897 A1 | 12/2017 | Pueschner et al. |
| 2018/0088865 A1 | 3/2018 | Lee et al. |
| 2018/0174002 A1 | 6/2018 | Hunt et al. |
| 2021/0049331 A1 | 2/2021 | Yang |

FOREIGN PATENT DOCUMENTS

| | | | |
|---|---|---|---|
| CN | 103094793 | A | 5/2013 |
| CN | 103164737 | A | 6/2013 |
| CN | 203481567 | U | 3/2014 |
| CN | 104242995 | A | 12/2014 |
| CN | 204012075 | U | 12/2014 |
| CN | 104485548 | A | 4/2015 |
| CN | 204257983 | U | 4/2015 |
| CN | 204291063 | U | 4/2015 |
| CN | 204668559 | U | 9/2015 |
| CN | 105137260 | A | 12/2015 |
| CN | 105791507 | A | 7/2016 |
| CN | 106161706 | A | 11/2016 |
| CN | 106231828 | A | 12/2016 |
| CN | 106412152 | A | 2/2017 |
| CN | 106571558 | A | 4/2017 |
| CN | 107069272 | A | 8/2017 |
| CN | 206931104 | U | 1/2018 |
| JP | 2008257506 | A | 10/2008 |

OTHER PUBLICATIONS

Office Action issued in JP 2020-541524, dated Sep. 6, 2021, 7 pages.
Notice of Allowance issued in CN 202010108941.2, dated Jul. 6, 2021, total 4 pages.
Examination Report issued in Indian Application No. 202047027564, dated Jul. 13, 2021, total 5 pages.
Chinese Office Action for Application No. 202010108935.7 dated Feb. 20, 2021, 7 pages.
Office Action issued in CN 202010108941.2 dated Feb. 2, 2021, total 3 pages.
International Search Report issued in CN 2020101089412 dated Jan. 22, 2021, total 3 pages.
Extended European Search Report dated Dec. 3, 2020, issued in EP Application No. 189039969 total 7 pages.

* cited by examiner

ELECTRONIC DEVICE

CROSS-REFERENCE TO RELATED APPLICATIONS

This application is continuation of U.S. patent application Ser. No. 16/966,891, filed on Aug. 1, 2020, which is a National Stage of International Application No. PCT/CN2018/074994, filed on Feb. 1, 2018. Both of the aforementioned applications are hereby incorporated by reference in their entireties.

TECHNICAL FIELD

Various embodiments relate to the field of terminal technologies, and in particular, to an electronic device.

BACKGROUND

With development of terminal technologies, an integration level of a chip in an electronic device is increasingly high, and therefore an increasingly high requirement is imposed on space utilization of the electronic device.

Currently, an external memory card and a subscriber identity module (nano subscriber identity module) (Nano SIM card for short) are used on the electronic device. A memory card such as a micro secure digital memory card (Micro SD card for short) is used as an example, a size of the micro SD card is usually 11 mm×15 mm, a size of the nano SIM card is usually 8.8 mm×12.3 mm, and an area difference between the two cards is 56 mm$^2$. In addition, an area of a micro SD card interface is larger than an area of a nano SIM card interface by 130 mm$^2$.

Because space occupied by an external memory card and a card interface is relatively large, and a structure of a mobile phone device is designed to be increasingly compact, a problem that the space occupied by the external memory card and the card interface is relatively large needs to be urgently resolved.

SUMMARY

In various embodiments, to save space of an electronic device, a memory card that has a same appearance size as a nano SIM card is used (for ease of description, "a memory card that has a same appearance size as a nano SIM card" is referred to as "a nano memory card" in some embodiments), and the nano SIM card and the nano memory card are compatible with each other through a nano SIM card interface of the electronic device. That is, the nano SIM card may be inserted into the nano SIM card interface of the electronic device to implement a user identification function, and the nano memory card may also be inserted into the nano SIM card interface of the electronic device to implement a storage function. The electronic device identifies that a card inserted into the card interface is the nano SIM card or the nano memory card, and then switches a circuit corresponding to the nano SIM card or a circuit corresponding to the nano memory card, to implement the user identification function or the storage function.

Various embodiments provide an electronic device, configured to: when a memory card that has a same appearance size as a SIM card is used to implement a storage function to save space of the electronic device, identify a type of a card inserted into a card interface of the electronic device.

According to a first aspect, an embodiment of this application provides an electronic device, and the electronic device includes a card interface and a processing module, where the card interface is electrically connected to the processing module, and a SIM card or a memory card may be inserted into the card interface;

the card interface includes N springs, where N>1; when a memory card is inserted into the card interface, the memory card is electrically connected to the processing module; and when a SIM card is inserted into the card interface, the SIM card is electrically connected to the processing module, and one metal pin of the SIM card is electrically connected to a first spring in the N springs and one spring adjacent to the first spring; and the processing module is configured to determine, based on at least a level of the first spring, that an inserted card is a SIM card or a memory card.

The card interface may be a nano SIM card interface, the SIM card inserted into the card interface may be a nano SIM card, and the memory card inserted into the card interface may be a nano memory card (for example, an SD card) that has a same appearance as the nano SIM card. The N springs of the card interface are electrically connected to the processing module. When a card is inserted into the card interface, metal pins of the card are electrically connected to the N springs of the card interface, and the card is electrically connected to the processing module by using the N springs of the card interface.

According to the foregoing solution, the electronic device includes the card interface and the processing module. When a memory card is inserted into the card interface, the memory card is electrically connected to the processing module to implement a storage function of the electronic device. When a SIM card is inserted into the card interface, the SIM card is electrically connected to the processing module, and one metal pin of the SIM card is electrically connected to the first spring in the N springs and one spring adjacent to the first spring. The processing module determines, based on at least the level of the first spring, that the inserted card is a SIM card or a memory card. When a SIM card is inserted, a short circuit occurs between the first spring and the adjacent spring, and the short-circuit phenomenon causes a current level of the first spring to be different from a default level. If the processing module determines that the level of the first spring is the default level, the processing module may determine that the inserted card is a memory card. If the processing module determines that the level of the first spring is not the default level, the processing module may determine that the inserted card is a SIM card.

In a possible design, the SIM card inserted into the card interface may be a nano SIM card, and the memory card inserted into the card interface may be an SD card that has a same appearance as the nano SIM card. According to the foregoing solution, the memory card may be an SD card in implementation.

In a possible design, the electronic device further includes a power interface, three analog switches, and six storage communications interfaces and three SIM communications interfaces that are connected to the processing module, where the power interface is electrically connected to a second spring used for connecting to a power supply in the N springs; first ends of the three analog switches are respectively connected to three of the N springs, and second ends of the three analog switches are respectively connected to three of the six storage communications interfaces through a switching operation or are respectively connected to the three SIM communications interfaces through a switching operation; and in the six storage communications interfaces other than the three storage communications interfaces, a first storage communications interface is connected to the first spring, a second storage communications interface is connected to a fourth spring in the N springs, and a third storage communications interface is connected to a fifth spring in the N springs.

When the electronic device detects that a card is inserted, the power interface provides voltage, so that the card is powered on, and the processing module determines a type of the inserted card based on the level of the first spring.

According to the foregoing solution, a structure of the electronic device is provided. In this structure, the memory card may be an SD card, and the SIM card may be a nano SIM card.

In a possible design, the processing module is further configured to: when determining that the inserted card is a SIM card, control the second ends of the three analog switches to be respectively connected to the three SIM communications interfaces; and when determining that the inserted card is a memory card, control the second ends of the three analog switches to be respectively connected to the three storage communications interfaces.

According to the foregoing solution, after the type of the inserted card is identified, the card may be communicatively connected to the processing module to implement a corresponding function.

In a possible design, the electronic device further includes a near field communication NFC module and an NFC analog switch. A first end of the NFC analog switch is connected to the fifth spring, and a second end is connected to the third storage communications interface or the NFC module through a switching operation. The NFC module is configured to implement an NFC function when the NFC module is connected to the NFC analog switch.

According to the foregoing solution, an interface with an NFC function may be provided for the electronic device to implement an NFC function of the electronic device.

The following describes manners in which the processing module determines, based on at least the level of the first spring, that the inserted card is a SIM card or a memory card.

In a possible design, the processing module may determine that the inserted card is a SIM card or a memory card in the following manners: if the first spring is adjacent to the second spring used for connecting to a power supply in the N springs, and a default level of the first spring is a low level, when the first spring is at a high level, the processing module determines that the inserted card is a SIM card; or when the first spring is at a low level, the processing module determines that the inserted card is a memory card; and/or if the first spring is adjacent to a third spring used for grounding in the N springs, and a default level of the first spring is a high level, when the first spring is at a low level, the processing module determines that the inserted card is a SIM card; or when the first spring is at a high level, the processing module determines that the inserted card is a memory card.

In the first manner, the default level of the first spring is a low level. The first spring is adjacent to the second spring (VCC spring), and a metal pin corresponding to the first spring and a metal pin corresponding to the second spring are obtained by splitting one metal pin of the SIM card. Therefore, when the SIM card is inserted into the card interface, one metal pin of the SIM card covers both the first spring and the second spring, a short circuit occurs between the first spring and the second spring, and a level of the first spring is pulled up to a high level by the second spring. When determining that the first spring is at a high level, the processing module may determine that the inserted card is a SIM card.

In the second manner, the default level of the first spring is a high level. The first spring is adjacent to the third spring (GND spring), and a metal pin corresponding to the first spring and a metal pin corresponding to the third spring are obtained by splitting one metal pin of the SIM card. Therefore, when the SIM card is inserted into the card interface, one metal pin of the SIM card covers both the first spring and the third spring, a short circuit occurs between the first spring and the third spring, and a level of the first spring is pulled down to a low level by the third spring. When determining that the first spring is at a low level, the processing module may determine that the inserted card is a SIM card.

In a possible design, the processing module may determine that the inserted card is a SIM card or a memory card in the following manners: if the default level of the first spring is a low level, and the processing module configures a default level of a spring adjacent to the first spring to a high level, when the first spring is at a high level, the processing module determines that the inserted card is a SIM card; or when the first spring is at a low level, the processing module determines that the inserted card is a memory card; and/or if the default level of the first spring is a high level, and the processing module configures a default level of a spring adjacent to the first spring to a low level, when the first spring is at a low level, the processing module determines that the inserted card is a SIM card; or when the first spring is at a high level, the processing module determines that the inserted card is a memory card.

In the first manner, the default level of the first spring is a low level, and the default level of the spring adjacent to the first spring is a high level. A metal pin corresponding to the first spring and a metal pin corresponding to the adjacent spring are obtained by splitting one metal pin of the SIM card. Therefore, when the SIM card is inserted into the card interface, one metal pin of the SIM card covers both the first spring and the spring, a short circuit occurs between the first spring and the spring, and a level of the first spring is pulled up to a high level by the spring. When determining that the first spring is at a high level, the processing module may determine that the inserted card is a SIM card.

In the second manner, the default level of the first spring is a high level, and the default level of the spring adjacent to the first spring is a low level. A metal pin corresponding to the first spring and a metal pin corresponding to the adjacent spring are obtained by splitting one metal pin of the SIM card. Therefore, when the SIM card is inserted into the card interface, one metal pin of the SIM card covers both the first spring and the spring, a short circuit occurs between the first spring and the spring, and a level of the first spring is pulled down to a low level by the spring. When determining that the first spring is at a low level, the processing module may determine that the inserted card is a SIM card.

In a possible design, the processing module is further configured to: determine, based on a level of the fourth spring in the N springs, that the inserted card is a SIM card or a memory card. According to the foregoing solution, the processing module may determine the type of the inserted card based on the level of the fourth spring, so that the processing module determines the card type more accurately.

In a possible design, the processing module may determine that the inserted card is a SIM card or a memory card in the following manners: if the fourth spring is adjacent to the second spring used for connecting to a power supply in the N springs, and a default level of the fourth spring is a low level, when the fourth spring is at a high level, the processing module determines that the inserted card is a SIM card; or when the fourth spring is at a low level, the processing module determines that the inserted card is a memory card; and/or if the fourth spring is adjacent to the third spring used for grounding in the N springs, and a default level of the fourth spring is a high level, when the fourth spring is at a low level, the processing module determines that the inserted card is a SIM card; or when the fourth spring is at a high level, the processing module determines that the inserted card is a memory card.

In the first manner, the default level of the fourth spring is a low level. The fourth spring is adjacent to the second spring (VCC spring), and a metal pin corresponding to the fourth spring and a metal pin corresponding to the second spring are obtained by splitting one metal pin of the SIM card. Therefore, when the SIM card is inserted into the card interface, one metal pin of the SIM card covers both the fourth spring and the second spring, a short circuit occurs between the fourth spring and the second spring, and a level of the fourth spring is pulled up to a high level by the second spring. When determining that the fourth spring is at a high level, the processing module may determine that the inserted card is a SIM card.

In the second manner, the default level of the fourth spring is a high level. The fourth spring is adjacent to the third spring (GND spring), and a metal pin corresponding to the fourth spring and a metal pin corresponding to the third spring are obtained by splitting one metal pin of the SIM card. Therefore, when the SIM card is inserted into the card interface, one metal pin of the SIM card covers both the fourth spring and the third spring, a short circuit occurs between the fourth spring and the third spring, and a level of the fourth spring is pulled down to a low level by the third spring. When determining that the fourth spring is at a low level, the processing module may determine that the inserted card is a SIM card.

In a possible design, the processing module may determine that the inserted card is a SIM card or a memory card in the following manners: if the default level of the fourth spring is a low level, and the processing module configures a default level of a spring adjacent to the fourth spring to a high level, when the fourth spring is at a high level, the processing module determines that the inserted card is a SIM card; or when the fourth spring is at a low level, the processing module determines that the inserted card is a memory card; and/or if the default level of the fourth spring is a high level, and the processing module configures a default level of a spring adjacent to the fourth spring to a low level, when the fourth spring is at a low level, the processing module determines that the inserted card is a SIM card; or when the fourth spring is at a high level, the processing module determines that the inserted card is a memory card.

In the first manner, the default level of the fourth spring is a low level, and the default level of the spring adjacent to the fourth spring is a high level. A metal pin corresponding to the fourth spring and a metal pin corresponding to the adjacent spring are obtained by splitting one metal pin of the SIM card. Therefore, when the SIM card is inserted into the card interface, one metal pin of the SIM card covers both the fourth spring and the spring, a short circuit occurs between the fourth spring and the spring, and a level of the fourth spring is pulled up to a high level by the spring. When determining that the fourth spring is at a high level, the processing module may determine that the inserted card is a SIM card.

In the second manner, the default level of the fourth spring is a high level, and the default level of the spring adjacent to the fourth spring is a low level. A metal pin corresponding to the fourth spring and a metal pin corresponding to the adjacent spring are obtained by splitting one metal pin of the SIM card. Therefore, when the SIM card is inserted into the card interface, one metal pin of the SIM card covers both the fourth spring and the spring, a short circuit occurs between the fourth spring and the spring, and a level of the fourth spring is pulled down to a low level by the spring. When determining that the fourth spring switches from a high level to a low level, the processing module may determine that the inserted card is a SIM card.

If the inserted card is a SIM card, the electronic device provided in the first aspect may further detect a level of a spring on the card interface to determine whether the SIM card is abnormal. The following describes in detail a solution for detecting an abnormal state of the SIM card.

In a possible design, the processing module is further configured to configure a default level of a first specified spring that is in the N springs other than the first spring and that is adjacent to the second spring used for connecting to a power supply in the N springs to a low level.

After configuring the default level of the first specified spring, the processing module may detect the abnormal state of the SIM card in the following three manners.

First Manner

In a possible design, the processing module is further configured to: if the first spring is adjacent to the second spring used for connecting to a power supply in the N springs, and the default level of the first spring is a low level, when the first spring is at a low level and the first specified spring is at a high level, determine, by the processing module, that a short circuit occurs between the second spring and the first specified spring and an open circuit occurs between the second spring and the first spring.

The first spring is at a low level and the first specified spring is at a high level. In other words, because of an error in cutting the SIM card, the second spring is connected to a metal pin corresponding to the first specified spring in the SIM card and is disconnected from the metal pin corresponding to the first spring. In this case, the first spring is at a low level and the first specified spring is at a high level. The processing module may determine, based on the level of the first spring and the level of the first specified spring, that a short circuit occurs between the second spring and the first specified spring and an open circuit occurs between the second spring and the first spring.

Second Manner

In a possible design, the processing module is further configured to: if the first spring is adjacent to the second spring used for connecting to a power supply in the N springs, and the default level of the first spring is a low level, when the first spring is at a low level and the first specified spring is at a low level, determine, by the processing module, that an open circuit occurs between the second spring and the first specified spring and an open circuit occurs between the second spring and the first spring.

The first spring is at a low level and the first specified spring is at a low level. In other words, because of an error in cutting the SIM card, the second spring is disconnected from a metal pin corresponding to the first specified spring in the SIM card and is also disconnected from the metal pin corresponding to the first spring, and the second spring is connected to an insulation gap between metal pins in the SIM card. In this case, both the first spring and the first specified spring are at a low level. The processing module may determine, based on the level of the first spring and the level of the first specified spring, that an open circuit occurs between the second spring and the first specified spring and an open circuit occurs between the second spring and the first spring.

The processing module may perform corresponding processing on the first abnormal state and the second abnormal state to rectify an anomaly. The processing module may control the power interface to be conducted to the first storage communications interface, and control a ground interface to be conducted to the second storage communications interface. The first storage communications interface is connected to the first spring, the second storage communications interface is connected to the fourth spring in the N springs, and the fourth spring and the first spring are symmetrically distributed on the card interface.

According to the foregoing solution, the power interface is conducted to the first storage communications interface to change a level of the first spring on the card interface to a high level, so that the SIM card is powered on. In addition, the ground interface is conducted to the second storage communications interface to change a level of the fourth spring on the card interface to a low level, so that the SIM card is grounded.

Third Manner

In a possible design, the processing module is further configured to: if the first spring is adjacent to the second spring used for connecting to a power supply in the N springs, and the default level of the first spring is a low level, when the first spring is at a high level and the first specified spring is at a high level, determine, by the processing module, that a short circuit occurs between the second spring and the first specified spring and a short circuit occurs between the second spring and the first spring.

The first spring is at a high level and the first specified spring is at a high level. In other words, because of an error in cutting the SIM card, the second spring is connected to a metal pin corresponding to the first specified spring in the SIM card and is also connected to the metal pin corresponding to the first spring. In this case, both the first spring and the first specified spring are at a high level. The processing module may determine, based on the level of the first spring and the level of the first specified spring, that a short circuit occurs between the second spring and the first specified spring and a short circuit occurs between the second spring and the first spring.

The third abnormal state cannot be eliminated in the electronic device. In this case, the processing module may generate first user prompt information, where the first user prompt information is used to notify a user that the SIM card is abnormal, that is, the user is notified that a cutting tolerance of the SIM card is excessively large, and consequently the SIM card cannot be used.

In addition, whether the SIM card is abnormal may be further determined by detecting a level of a spring adjacent to the third spring (GND spring).

In a possible design, the processing module is further configured to configure a default level of a second specified spring that is in the N springs other than the first spring and that is adjacent to the third spring used for grounding in the N springs to a high level.

After configuring the default level of the second specified spring, the processing module may detect the abnormal state of the SIM card in the following three manners.

First Manner

In a possible design, the processing module is further configured to: if the first spring is adjacent to the third spring used for grounding in the N springs, and the default level of the first spring is a high level, when the first spring is at a high level and the second specified spring is at a low level, determine, by the processing module, that a short circuit occurs between the third spring and the second specified spring and an open circuit occurs between the third spring and the first spring.

The first spring is at a high level and the second specified spring is at a low level. In other words, because of an error in cutting the SIM card, the third spring is connected to a metal pin corresponding to the second specified spring in the SIM card and is disconnected from the metal pin corresponding to the first spring. In this case, the first spring is at a high level and the second specified spring is at a low level. The processing module may determine, based on the level of the first spring and the level of the second specified spring, that a short circuit occurs between the third spring and the second specified spring and an open circuit occurs between the third spring and the first spring.

Second Manner

In a possible design, the processing module is further configured to: if the first spring is adjacent to the third spring used for grounding in the N springs, and the default level of the first spring is a high level, when the first spring is at a high level and the second specified spring is at a high level, determine, by the processing module, that an open circuit occurs between the third spring and the second specified spring and an open circuit occurs between the third spring and the first spring.

The first spring is at a high level and the second specified spring is at a high level. In other words, because of an error in cutting the SIM card, the third spring is disconnected from a metal pin corresponding to the second specified spring in the SIM card and is also disconnected from the metal pin corresponding to the first spring, and the third spring is connected to an insulation gap between metal pins in the SIM card. In this case, both the first spring and the second specified spring are at a high level. The processing module may determine, based on the level of the first spring and the level of the second specified spring, that an open circuit occurs between the third spring and the second specified spring and an open circuit occurs between the third spring and the first spring.

The processing module may perform corresponding processing on the first abnormal state and the second abnormal state to rectify an anomaly. The processing module may control the power interface to be conducted to the first storage communications interface, and control the ground interface to be conducted to the second storage communications interface. The first storage communications interface is connected to the first spring, the second storage communications interface is connected to the fourth spring in the N springs, and the fourth spring and the first spring are symmetrically distributed on the card interface.

According to the foregoing solution, the power interface is conducted to the first storage communications interface to change a level of the first spring on the card interface to a high level, so that the SIM card is powered on. In addition, the ground interface is conducted to the second storage communications interface to change a level of the fourth spring on the card interface to a low level, so that the SIM card is grounded.

Third Manner

In a possible design, the processing module is further configured to: if the first spring is adjacent to the third spring used for grounding in the N springs, and the default level of the first spring is a high level, when the first spring is at a low level and the second specified spring is at a low level, determine, by the processing module, that a short circuit occurs between the third spring and the second specified spring and a short circuit occurs between the third spring and the first spring.

The first spring is at a low level and the second specified spring is at a low level. In other words, because of an error in cutting the SIM card, the third spring is connected to a metal pin corresponding to the second specified spring in the SIM card and is also connected to the metal pin corresponding to the first spring. In this case, both the first spring and the second specified spring are at a low level. The processing module may determine, based on the level of the first spring and the level of the second specified spring, that a short circuit occurs between the third spring and the second specified spring and a short circuit occurs between the third spring and the first spring.

The third abnormal state cannot be eliminated in the electronic device. In this case, the processing module may generate second user prompt information, where the second user prompt information is used to notify the user that the SIM card is abnormal, that is, the user is notified that a cutting tolerance of the SIM card is excessively large, and consequently the SIM card cannot be used.

According to a second aspect, an embodiment of this application provides an electronic device, and the electronic device includes a card interface and a processing module. The card interface is electrically connected to the processing module, and a SIM card or a memory card may be inserted into the card interface. The card interface includes N springs, where N>1; when a memory card is inserted into the card interface, the memory card is electrically connected to the processing module; and when a SIM card is inserted into the card interface, the SIM card is electrically connected to the processing module.

The processing module is configured to: perform, through a SIM card initialization procedure, a first initialization operation on a card inserted into the card interface; and if the first initialization operation succeeds, determine that the card inserted into the card interface is a SIM card; or if the first initialization operation fails, perform, through a memory card initialization procedure, a second initialization operation on the card inserted into the card interface, and if the second initialization operation succeeds, determine that the card inserted into the card interface is a memory card, or if the second initialization operation fails, determine that no card is inserted into the card interface or the card inserted into the card interface is invalid.

According to the foregoing solution, a type of the inserted card may be determined by determining whether the inserted card can be initialized through a corresponding initialization operation.

According to a third aspect, an embodiment of this application provides an electronic device, and the electronic device includes a card interface and a processing module. The card interface is electrically connected to the processing module, and a SIM card or a memory card may be inserted into the card interface. The card interface includes N springs, where N>1; when a memory card is inserted into the card interface, the memory card is electrically connected to the processing module; and when a SIM card is inserted into the card interface, the SIM card is electrically connected to the processing module.

The processing module is configured to: perform, through a memory card initialization procedure, a third initialization operation on a card inserted into the card interface; and if the third initialization operation succeeds, determine that the card inserted into the card interface is a memory card; or if the third initialization operation fails, perform, through a SIM card initialization procedure, a fourth initialization operation on the card inserted into the card interface, and if the fourth initialization operation succeeds, determine that the card inserted into the card interface is a SIM card, or if the fourth initialization operation fails, determine that no card is inserted into the card interface or the card inserted into the card interface is invalid. According to the foregoing solution, a type of the inserted card may be determined by determining whether the inserted card can be initialized through a corresponding initialization operation.

According to the foregoing solution, a type of the inserted card may be determined by determining whether the inserted card can be initialized through a corresponding initialization operation.

DESCRIPTION OF EMBODIMENTS

In various embodiments, to save space of an electronic device, a memory card that has a same appearance size as a nano SIM card is used (for ease of description, "a memory card that has a same appearance size as a nano SIM card" is referred to as "a nano memory card" in some embodiments), and the nano SIM card and the nano memory card are compatible with each other through a nano SIM card interface of the electronic device. That is, the nano SIM card may be inserted into the nano SIM card interface of the electronic device to implement a user identification function, and the nano memory card may also be inserted into the nano SIM card interface of the electronic device to implement a storage function. The electronic device identifies that a card inserted into the card interface is the nano SIM card or the nano memory card, and then switches a circuit corresponding to the nano SIM card or a circuit corresponding to the nano memory card, to implement the user identification function or the storage function.

Figure 1:
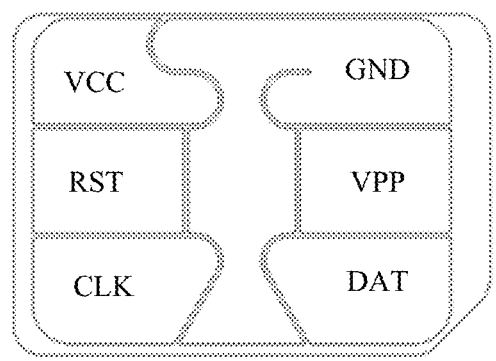
FIG. 1 is a schematic diagram of an appearance of a nano SIM card according to an embodiment of this application.

In various embodiments, an appearance of the nano SIM card in accordance with the present disclosure is shown in FIG. 1. The nano SIM card includes six metal pins, each metal pin is used to transmit one signal, and metal pins are isolated from each other by using an insulation gap.

A metal pin of a SIM card is a pin that has a contact area and has a conductive function on the SIM card.

It should be noted that three metal pins on the left are used to transmit three signals: CLK, RST, and VCC, and three metal pins on the right are used to transmit three signals: DAT, VPP, and GND. The three metal pins on the left and the three metal pins on the right are isolated by using GND, that is, an area between the three metal pins on the left and the three metal pins on the right is grounded.

Definitions of the metal pins of the nano SIM card shown in FIG. 1 may be shown in Table 1.

TABLE 1

| Metal pin number (Pin #) | Metal pin name (Name) | Type (Type) | Description (Description) |
|---|---|---|---|
| 1 | CLK | I | Clock (Clock) |
| 2 | DAT | I/O | Data (Data Line) |
| 3 | RST | I | Reset signal (Reset Signal) |
| 4 | VPP | S/I | Programming voltage/Input signal (Programming Voltage/Input Signal) |
| 5 | VCC | S | Power supply (Power Supply) |
| 6 | GND | S | Ground (Power Supply ground) |

In the definitions of the metal pins of the SIM card shown in Table 1, CLK represents a clock signal. A processing module transmits a clock signal to the nano SIM card by using a CLK metal pin, and the nano SIM card works in a time sequence determined by using the clock signal. DAT is used to transmit data between the processing module and the nano SIM card. RST is used by the processing module to transmit a reset signal to the nano SIM card. VPP is a metal pin that needs to be used in a test phase before delivery of the electronic device. After delivery of the electronic device, if the electronic device has a near field communication (NFC) function, the VPP metal pin may be used to implement the NFC function, or if the electronic device does not have an NFC function, the VPP metal pin is not used. VCC and GND are respectively used for connecting to a power supply and grounding.

When a memory card that has a same appearance size as the nano SIM card is being designed, a quantity of metal pins of the memory card and definitions of the metal pins need to be considered. A memory card such as a micro SD card is used as an example, and definitions of metal pins of the micro SD card may be shown in Table 2.

TABLE 2

| Metal pin number (Pin#) | Metal pin name (Name) | Type (Type) | Description (Description) |
|---|---|---|---|
| 1 | CD/DAT3 | I/O | Data (Data Line) [Bit3] |
| 2 | CMD | I/O | Command/Response (Command/Response) |
| 3 | CLK | I | Clock (Clock) |
| 4 | DAT0 | I/O | Data (Data Line) [Bit0] |
| 5 | DAT1 | I/O | Data (Data Line) [Bit1] |
| 6 | DAT2 | I/O | Data (Data Line) [Bit2] |
| 7 | VCC | S | Power supply (Power Supply) |
| 8 | GND | S | Ground (Power Supply ground) |

In the definitions of the metal pins of the micro SD card shown in Table 2, DAT0, DAT1, DAT2, and DAT3 are used to transmit data between the processing module and the micro SD card. CMD is used to transmit a command message and a response message. CLK represents a clock signal. The processing module transmits a clock signal to the micro SD card by using CLK, and the micro SD card works in a time sequence determined by using the clock signal. VCC and GND are respectively used for connecting to a power supply and grounding.

It can be learned from the definitions of the metal pins of the micro SD card shown in Table 2 that there are two more metal pins of the micro SD card than those of the nano SIM card. Therefore, to implement the storage function by using an SD card (referred to as a "nano SD card" below for ease of description) that has a same appearance size as the nano SIM card, two metal pins need to be added to the six metal pins of the nano SIM card shown in FIG. 1. In various embodiments, a metal pin splitting solution is used, that is, two metal pins are selected from the six metal pins of the nano SIM card, and each selected metal pin is split into two metal pins, so that eight signals are transmitted in the nano SD card.

It should be noted that in some various embodiments, the nano SD card has a same appearance size as the nano SIM card, but definitions of metal pins of the nano SD card are the same as the definitions of the metal pins of the micro SD card shown in Table 2.

In addition, in various embodiments, in addition to considering a difference between a quantity of metal pins of the nano SD card and a quantity of metal pins of the nano SIM card, a correspondence between a nano SD card signal and a nano SIM card signal needs to be specified. That is, for a spring on the card interface, when the nano SIM card is inserted into the card interface, the spring is used to transmit which type of signal is specified; and correspondingly, when the nano SD card is inserted into the card interface, the spring is used to transmit which type of signal is specified.

For example, when the correspondence between a nano SD card signal and a nano SIM card signal is being specified, the following information may be considered:

1. A power domain of each of the nano SD card and the nano SIM card is 1.8 V-3.3 V. Therefore, the two cards may share the power domain of power signals VCC and the power domain of ground signals GND. Therefore, it may be specified that a spring used to transmit a VCC signal when the nano SIM card is inserted is also used to transmit a VCC signal of the nano SD card when the nano SD card is inserted, and it may be specified that a spring used to transmit a GND signal when the nano SIM card is inserted is also used to transmit a GND signal of the nano SD card when the nano SD card is inserted. Power is supplied to the nano SD card and the nano SIM card by using a same power supply. Therefore, neither the VCC signal nor the GND signal needs to be switched regardless of whether the nano SIM card or the nano SD card is inserted into the card interface.

2. Because a clock signal needs to be used as a reference during working of the nano SD card and the nano SIM card, clock signals of the two cards may be transmitted by using one spring through time sharing. That is, it may be specified that a spring used to transmit a CLK signal when the nano SIM card is inserted is also used to transmit a CLK signal of the nano SD card when the nano SD card is inserted. Because the clock signals of the nano SD card and the nano SIM card are different, an analog switch needs to be disposed to switch the two CLK signals: the analog switch is switched to the CLK signal of the nano SIM card when the nano SIM card is inserted, and the analog switch is switched to the CLK signal of the nano SD card when the nano SD card is inserted.

3. It may be specified that a DAT signal of the nano SIM card corresponds to a DAT1 signal of the nano SD card, and an analog switch is disposed to switch the two signals (DAT/DAT1). It may be specified that an RST signal of the nano SIM card corresponds to a DAT0 signal of the nano SD card, and an analog switch is disposed to switch the two signals (RST/DAT0). It may be specified that a VPP signal of the nano SIM card corresponds to a CMD signal of the nano SD card, and if the electronic device has the NFC function, an analog switch may be disposed to switch the two signals (VPP/CMD); or if the electronic device does not have the NFC function, the VPP signal is not involved in a process of using the nano SIM card, and therefore an analog switch does not need to be disposed for signal switching.

4. In addition, a DAT2 signal and a DAT3 signal of the nano SD card may be transmitted by using two additional metal pins that are obtained after metal pin splitting is performed on the nano SIM card. Because the DAT2 signal and the DAT3 signal are used only by the nano SD card, an analog switch does not need to be disposed for signal switching.

It should be noted that the foregoing described correspondence between a nano SD card signal and a nano SIM card signal is merely an example, and the present disclosure is not limited to the foregoing correspondence in actual implementation, in other words, the correspondence between a nano SD card signal and a nano SIM card signal is not limited in some various embodiments. When the VCC signal of the nano SIM card corresponds to the VCC signal of the nano SD card and the GND signal of the nano SIM card corresponds to the GND signal of the nano SD card, implementation is easier.

As described above, the DAT2 signal and the DAT3 signal of the nano SD card may be transmitted by using two additional metal pins that are obtained after metal pin splitting is performed on the nano SIM card. Therefore, in some various embodiments, how to obtain a DAT2 metal pin and a DAT3 metal pin of the nano SD card through splitting needs to be further considered. The following uses the correspondence described in the foregoing four cases as an example to describe metal pin distribution of the nano SD card.

Example 1

Figure 2:
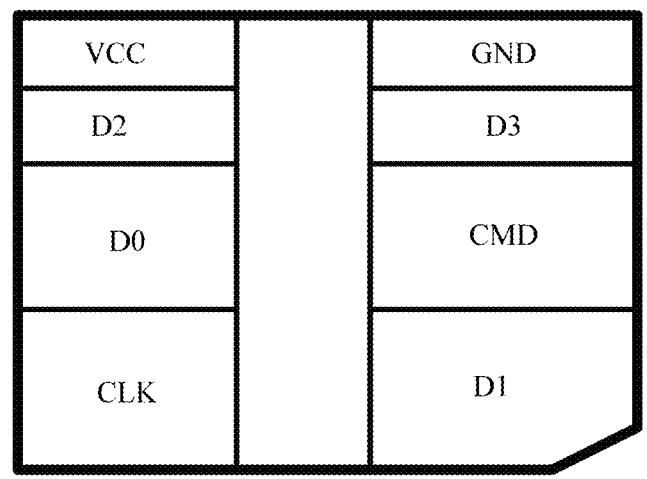
FIG. 2 is a first schematic diagram of metal pin distribution of an SD card that has a same appearance size as a nano SIM card according to an embodiment of this application.

Metal pin distribution of the nano SD card may be shown in FIG. 2. It can be learned from FIG. 2 that D2 and VCC are two metal pins that are obtained by performing splitting at a position of the VCC metal pin of the nano SIM card shown in FIG. 1, and D3 and GND are two metal pins that are obtained by performing splitting at a position of the GND metal pin of the nano SIM card shown in FIG. 1. In other words, the D2 metal pin and the D3 metal pin of the nano SD card may be obtained by respectively splitting the VCC metal pin and the GND metal pin of the nano SIM card. The DAT2 signal and the DAT3 signal of the nano SD card may be transmitted by using two additional metal pins obtained through splitting.

It may be learned from the nano SIM card shown in FIG. 1 that the VCC signal of the nano SIM card corresponds to the VCC signal of the nano SD card, the GND signal of the nano SIM card corresponds to the GND signal of the nano SD card, the CLK signal of the nano SIM card corresponds to the CLK signal of the nano SD card, the RST signal of the nano SIM card corresponds to the DAT0 signal of the nano SD card, the DAT signal of the nano SIM card corresponds to the DAT1 signal of the nano SD card, and the VPP signal of the nano SIM card corresponds to the CMD signal of the nano SD card.

Example 2

Figure 3:
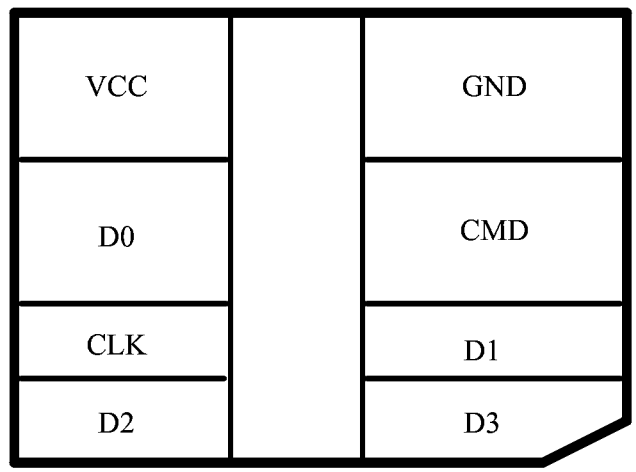
FIG. 3 is a second schematic diagram of metal pin distribution of an SD card that has a same appearance size as a nano SIM card according to an embodiment of this application.

Metal pin distribution of the nano SD card may be shown in FIG. 3. It can be learned from FIG. 3 that D2 and CLK are two metal pins that are obtained by performing splitting at a position of the CLK metal pin of the nano SIM card shown in FIG. 1, and D3 and DAT1 are two metal pins that are obtained by performing splitting at a position of the DAT metal pin of the nano SIM card shown in FIG. 1. In other words, the D2 metal pin and the D3 metal pin of the nano SD card may be obtained by respectively splitting the CLK metal pin and the DAT metal pin of the nano SIM card. The DAT2 signal and the DAT3 signal of the nano SD card may be transmitted by using two additional metal pins obtained through splitting.

Example 3

Figure 4:
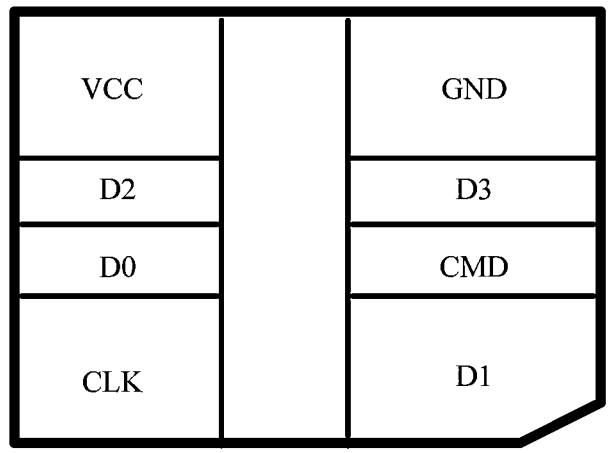
FIG. 4 is a third schematic diagram of metal pin distribution of an SD card that has a same appearance size as a nano SIM card according to an embodiment of this application.

Metal pin distribution of the nano SD card may be shown in FIG. 4. It can be learned from FIG. 4 that D2 and D0 are two metal pins that are obtained by performing splitting at a position of the RST metal pin of the nano SIM card shown in FIG. 1, and D3 and CMD are two metal pins that are obtained by performing splitting at a position of the VPP metal pin of the nano SIM card shown in FIG. 1. In other words, the D2 metal pin and the D3 metal pin of the nano SD card may be obtained by respectively splitting the RST metal pin and the VPP metal pin of the nano SIM card. The DAT2 signal and the DAT3 signal of the nano SD card may be transmitted by using two additional metal pins obtained through splitting.

Example 4

Figure 5:
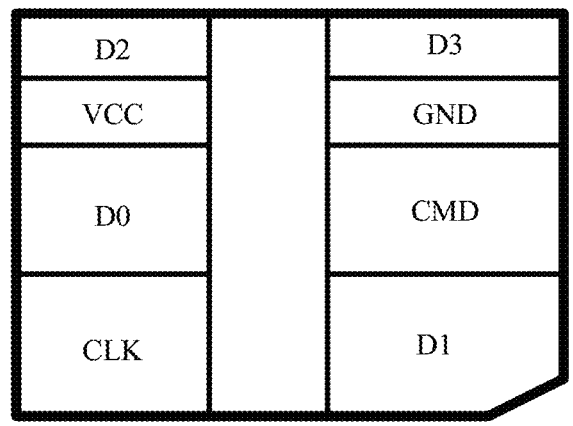
FIG. 5 is a fourth schematic diagram of metal pin distribution of an SD card that has a same appearance size as a nano SIM card according to an embodiment of this application.

Metal pin distribution of the nano SD card may be shown in FIG. 5. It can be learned from FIG. 5 that D2 and VCC are two metal pins that are obtained by performing splitting at a position of the VCC metal pin of the nano SIM card shown in FIG. 1, and D3 and GND are two metal pins that are obtained by performing splitting at a position of the GND metal pin of the nano SIM card shown in FIG. 1. In other words, the D2 metal pin and the D3 metal pin of the nano SD card may be obtained by respectively splitting the VCC metal pin and the GND metal pin of the nano SIM card. The DAT2 signal and the DAT3 signal of the nano SD card may be transmitted by using two additional metal pins obtained through splitting.

A difference between the metal pin distribution shown in FIG. 5 and the metal pin distribution shown in FIG. 2 lies in that a position relationship between the D2 metal pin and the VCC metal pin varies, and a location relationship between the D3 metal pin and the GND metal pin varies.

The foregoing four types of metal pin distribution are merely examples. In actual implementation, only two metal pins of the nano SIM card need to be split, and two metal pins obtained through splitting are used to transmit the DAT2 signal and the DAT3 signal of the nano SD card.

It should be noted that in some various embodiments, when the memory card that has a same appearance size as the nano SIM card is used to implement the storage function, a type of the memory card is not limited to the SD card in the foregoing example. In some various embodiments, the memory card may be alternatively a memory card based on an interface protocol such as a universal serial bus (USB), peripheral component interconnect express (PCIE), universal flash storage (UFS), a multimedia card (MMC), or an embedded multimedia card (EMMC).

When memory cards of different interface protocols are used, a quantity of metal pins of a memory card and definitions of the metal pins may be different from those of the SD card. Therefore, in implementation of various embodiments, different configuration may be performed with reference to the foregoing method for analyzing metal pin splitting and a correspondence between metal pin signals and with reference to an actual quantity of metal pins and definitions of the metal pins. In some various embodiments, only the SD card is used as an example for description.

Figure 6:
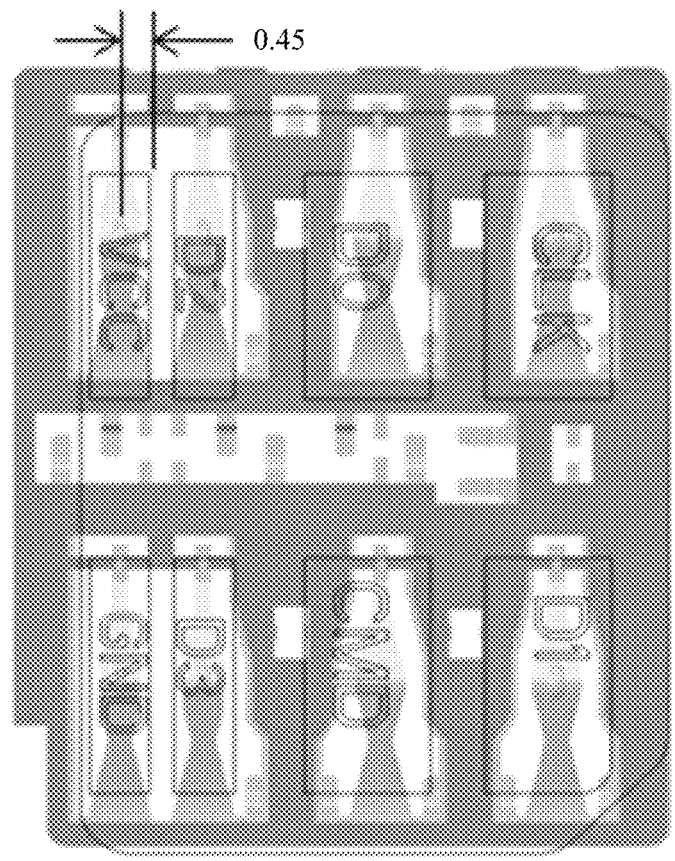
FIG. 6 is a schematic structural diagram of a card interface of a nano SD card according to an embodiment of this application.

After the metal pin distribution of the nano SD card is determined, a card interface of the nano SD card further needs to be designed based on the metal pin distribution of the nano SD card. The metal pin distribution of the nano SD card in Example 1 is used as an example, and a card interface of the nano SD card corresponding to the metal pin distribution may be shown in FIG. 6 (it should be noted that, a bottom view is used in FIG. 6, but a top view is used in FIG. 1 to FIG. 5 and in FIG. 12 to FIG. 14 below). FIG. 6 is a view in which a pin of a nano SD card is connected to a card interface. The card interface shown in FIG. 6 includes eight metal springs, and the eight metal springs are distributed to transmit eight signals of the nano SD card. When a SIM card is inserted into the card interface shown in FIG. 6, because a VCC metal pin used for connecting to a power supply in the SIM card covers two metal springs D2 and VCC, a short circuit occurs between the two metal springs D2 and VCC, that is, each of the two metal springs D2 and VCC is at a high level. Similarly, when a SIM card is inserted into the card interface shown in FIG. 6, because a GND metal pin used for grounding in the SIM card covers two metal springs D3 and GND, a short circuit occurs between the two metal springs D3 and GND, that is, each of the two metal springs D3 and GND is at a low level. In this case, six metal springs are distributed to transmit six signals of the nano SIM card.

In addition, a concept that two springs are adjacent to each other is included in some various embodiments. In some various embodiments, that two springs are adjacent to each other means that the two springs are located on a same side of the card interface, and the two springs are isolated by using only one insulation gap. For example, in FIG. 6, a VCC spring, a D2 spring, a DO spring, and a CLK spring are located on a same side of the card interface. The VCC spring is adjacent to the D2 spring, the D2 spring is adjacent to the DO spring, and the DO spring is adjacent to the CLK spring. Because a GND spring, a D3 spring, a CMD spring, and a D1 spring are not located on a same side of the card interface as the VCC spring, the GND spring, the D3 spring, the CMD spring, and the D1 spring are not adjacent to the VCC spring.

Figure 7:
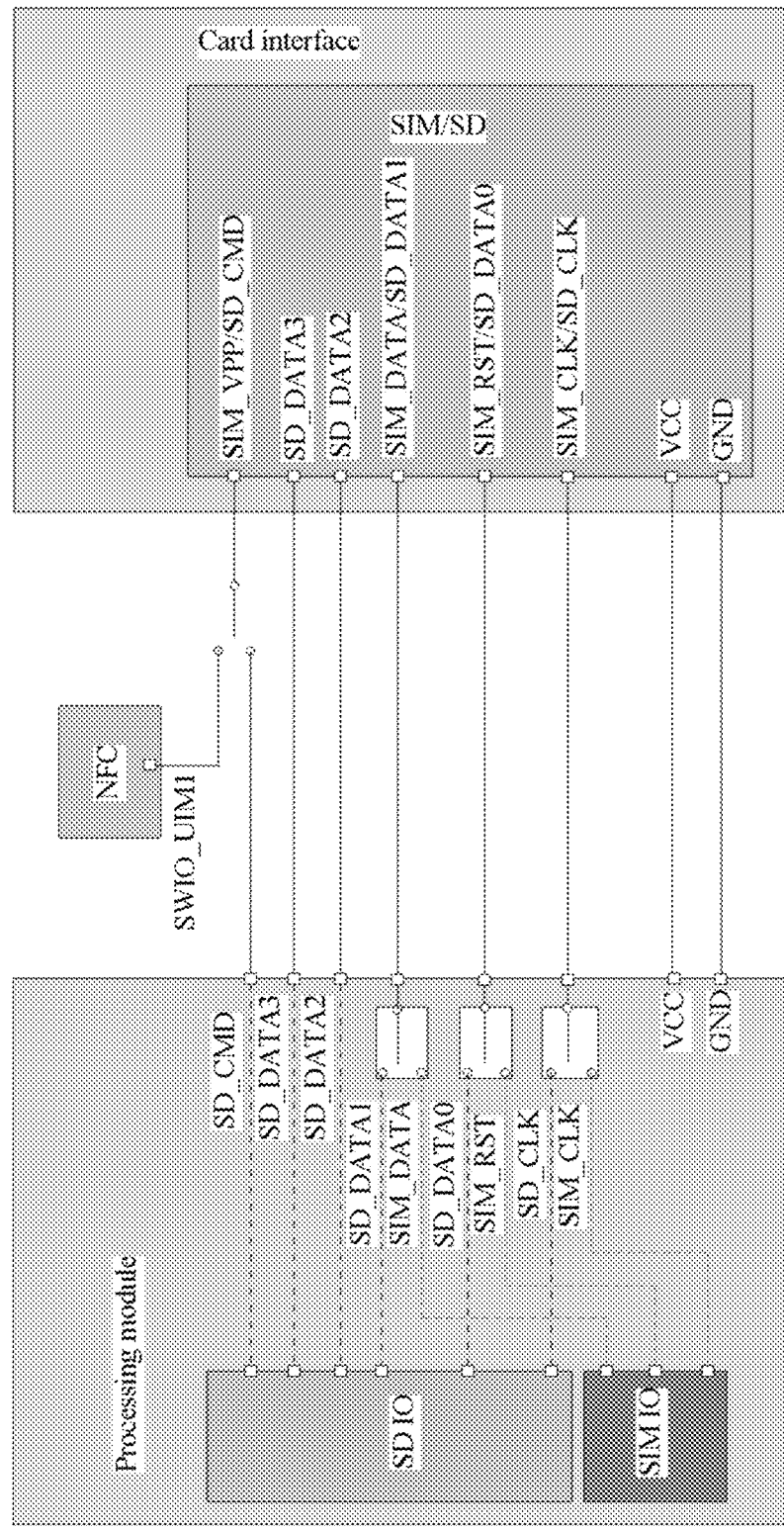
FIG. 7 is a schematic structural diagram of a system architecture according to an embodiment of this application.

Based on the foregoing description of the design solution in which a storage function is implemented by using a memory card that has a same appearance size as a nano SIM card and a memory card interface that has a same appearance size as a nano SIM card interface, a system architecture in some various embodiments may be shown in FIG. 7.

In FIG. 7, a correspondence between a nano SD card signal and a nano SIM card signal is the same as the correspondence in the foregoing example. That is, a VCC signal of a nano SIM card corresponds to a VCC signal of a nano SD card, a GND signal of the nano SIM card corresponds to a GND signal of the nano SD card, a CLK signal of the nano SIM card corresponds to a CLK signal of the nano SD card, an RST signal of the nano SIM card corresponds to a DAT0 signal of the nano SD card, a DAT signal of the nano SIM card corresponds to a DAT1 signal of the nano SD card, and a VPP signal of the nano SIM card corresponds to a CMD signal of the nano SD card.

A processing module of the system includes three switches. One end of the first switch is connected to SIM_DATA/SD_DATA1 on the card interface, and the other end is connected to an SD_DATA1 interface and a SIM_DATA interface in the processing module in a switching manner. One end of the second switch is connected to SIM_RST/SD_DATA0 on the card interface, and the other end is connected to an SD_DATA0 interface and a SIM_RST interface in the processing module in a switching manner. One end of the third switch is connected to SIM_CLK/SD_CLK on the card interface, and the other end is connected to an SD_CLK interface and a SIM_CLK interface in the processing module in a switching manner. When a SIM chip is inserted into the card interface, the three switches are respectively connected to interfaces in SIM IO to implement a user identification function. When an SD chip is inserted into the card interface, the three switches are respectively connected to interfaces in SD IO to implement a storage function.

In addition, the electronic device further includes an NFC module. The NFC module is connected to a SIM_VPP/SD_CMD spring on the card interface by using a switch. When a SIM card is inserted into the card interface, the switch is switched to the NFC module, and the electronic device may implement the NFC function. When an SD card is inserted into the card interface, the switch is switched to an SD_CMD interface in the processing module, and the electronic device may implement the storage function.

The following further describes in detail some various embodiments with reference to accompanying drawings.

It should be noted that in various embodiments, "a plurality of" means two or more. In addition, it should be understood that in the description of this application, terms such as "first" and "second" are merely used for distinction and description, but cannot be understood as indication or implication of relative importance, and cannot be understood as an indication or implication of a sequence.

Some embodiments provide an electronic device, configured to: when a memory card that has a same appearance size as a SIM card is used to implement a storage function to save space of the electronic device, identify a type of a card inserted into a card interface of the electronic device. The electronic device includes but is not limited to a smartphone, a smartwatch, a tablet computer, a virtual reality (VR) device, an augmented reality (AR) device, a personal computer, a handheld computer, and a personal digital assistant.

Figure 8:
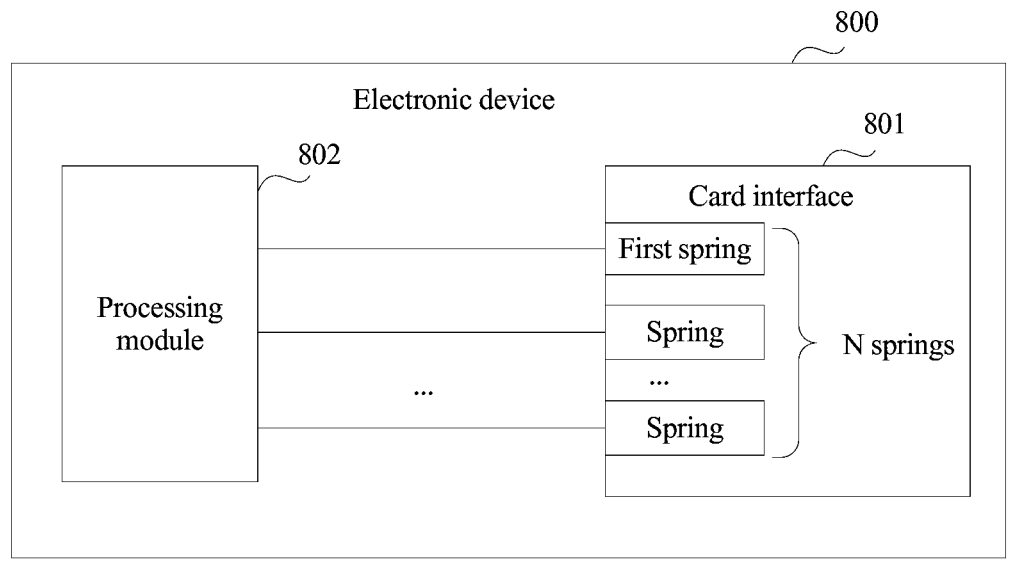
FIG. 8 is a first schematic structural diagram of an electronic device according to an embodiment of this application.

FIG. 8 is a schematic structural diagram of an electronic device according to an embodiment of this application. An electronic device 800 in FIG. 8 includes a card interface 801 and a processing module 802.

The card interface 801 includes N springs, where N>1; when a memory card is inserted into the card interface 801, the memory card is electrically connected to the processing module 802; and when a SIM card is inserted into the card interface 801, the SIM card is electrically connected to the processing module 802, and one metal pin of the SIM card is electrically connected to a first spring in the N springs and one spring adjacent to the first spring.

The processing module 802 is configured to determine, based on at least a level of the first spring, that an inserted card is a SIM card or a memory card.

The processing module 802 may determine a type of the inserted card based on at least the level of the first spring. In other words, the processing module 802 may alternatively determine the type of the inserted card based on a level of another spring. A manner of determining the type of the inserted card based on a level of another spring is subsequently described, and details are not described herein.

For example, in the electronic device 800 shown in FIG. 8, the card interface 801 may be a nano SIM card interface, the SIM card inserted into the card interface 801 may be a nano SIM card, and the memory card inserted into the card interface 801 may be a nano memory card (for example, an SD card) that has a same appearance as the nano SIM card. The N springs of the card interface 801 are electrically connected to the processing module 802. When a card is inserted into the card interface 801, metal pins of the card are electrically connected to the N springs of the card interface, and the card is electrically connected to the processing module 802 by using the N springs of the card interface.

In this embodiment, the processing module 802 may be a device that has a computing processing capability such as a system on chip (SOC), a central processing unit (CPU), an ARM (advanced RISC machine) processor, a field programmable gate array (FPGA), or a dedicated processor.

For example, if the memory card inserted into the card interface 801 is an SD card, N=8.

In this embodiment, when a SIM card is inserted, one metal pin of the SIM card is electrically connected to the first spring in the N springs and a spring adjacent to the first spring. In this case, a short circuit occurs between the first spring and the spring adjacent to the first spring. In other words, because metal pins of the SIM card and metal pins of the memory card are distributed differently, a quantity of signals transmitted when the SIM card is inserted into the card interface 801 is less than a quantity (N) of signals transmitted when the memory card is inserted into the card interface 801. To enable the same card interface 801 to be used to transmit both a SIM card signal and a memory card signal, when the SIM card signal is being transmitted, a case in which a spring and a spring adjacent to the spring are covered by a same metal pin of the SIM card inevitably occurs. For example, in FIG. 6, when the SIM card signal is being transmitted, a VCC metal pin used for connecting to a power supply in the SIM card covers two metal springs D2 and VCC, and a GND metal pin used for grounding in the SIM card covers two metal springs D3 and GND. In this case, a short circuit occurs between the D2 spring on the card interface 801 and the adjacent VCC spring, and a short circuit occurs between the D3 spring on the card interface 801 and the adjacent GND spring. In this example, each of the D2 spring and the D3 spring may be considered as the first spring.

It should be noted that in this embodiment, the first spring is a spring that is connected only to a storage communications interface in the electronic device 800. For example, each of an SD_DATA2 spring and an SD_DATA3 spring in FIG. 7 may be considered as the first spring, but none of a SIM_DATA/SD_DATA1 spring, a SIM_RST/SD_DATA0 spring, a SIM_CLK/SD_CLK spring, and the like is considered as the first spring.

In the electronic device 800, the processing module 802 determines the type of the inserted card (a SIM card or a memory card) based on at least the level of the first spring, and the processing module 802 may include a first detection circuit configured to detect the level of the first spring. For example, the first detection circuit may be a common GPIO circuit. That is, the first detection circuit includes a first PMOS, a first NMOS, and a first collection circuit. A gate of the first PMOS is connected to a gate of the first NMOS, a drain of the first PMOS is connected to a source of the first NMOS, a source of the first PMOS is connected to a power supply, and a drain of the first NMOS is grounded. Both the gate of the first PMOS and the gate of the first NMOS are connected to the first spring. An input end of the first collection circuit is connected to the first spring, an output end of the first collection circuit is connected to the processing module 802, and an input state is configured for the first detection circuit.

Figure 9:
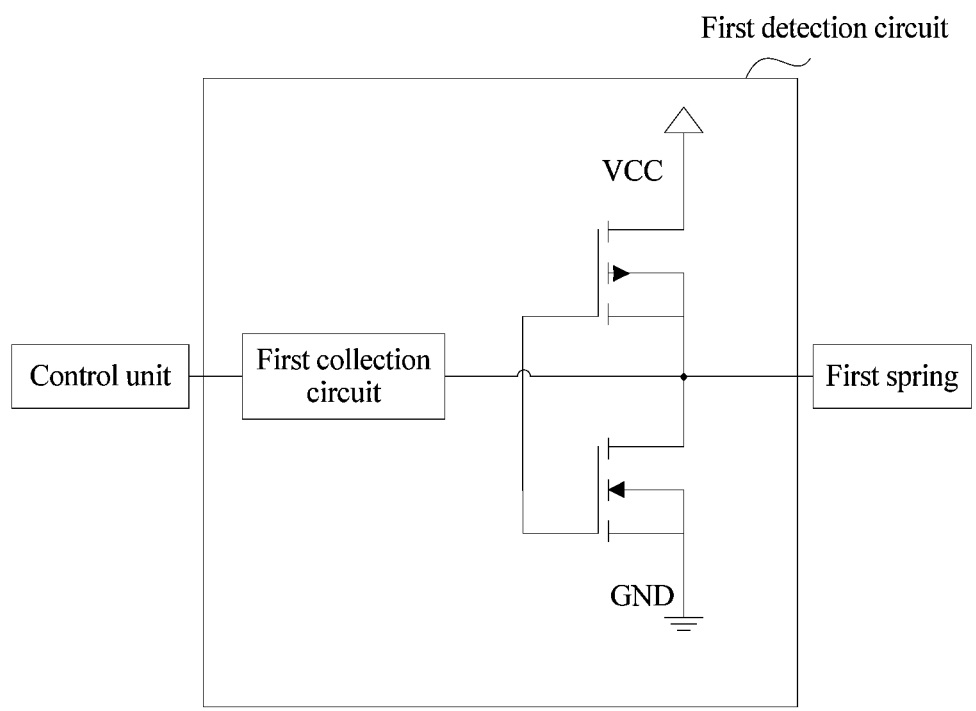
FIG. 9 is a schematic structural diagram of a first detection circuit according to an embodiment of this application.

For example, a structure of the first detection circuit may be shown in FIG. 9. In FIG. 9, a MOS whose source is connected to a positive electrode of the power supply may be considered as the first PMOS, and a MOS whose drain is grounded may be considered as the first NMOS. The gate of the first PMOS is connected to the gate of the first NMOS and is connected to the first spring. The input end of the first collection circuit is connected to the first spring, and the output end is connected to a control unit.

The control unit may determine, based on a detection result of the first detection circuit, a type of a card inserted into the card interface 801, to control a switching operation of a related switch in the electronic device 800.

It should be noted that an input state or an output state may be configured for the GPIO circuit. When an input state is configured for the GPIO circuit, the GPIO circuit may be configured to detect a level of a signal input into the circuit, and input impedance of the GPIO circuit is relatively large (10 kΩ orders of magnitude). When an output state is configured for the GPIO circuit, the GPIO circuit may be configured to configure a level required by the circuit, and input impedance of the GPIO circuit is relatively small (100Ω orders of magnitude). In this embodiment, because the first detection circuit is configured to detect the level of the first spring, an input state may be configured for the first detection circuit.

In addition, the GPIO circuit may be configured to a pull-up circuit or a pull-down circuit. When the GPIO circuit is configured to a pull-up circuit, a default level of a connection point of a gate of a PMOS and a gate of an NMOS in the GPIO circuit is a high level. When the GPIO circuit is configured to a pull-down circuit, a default level of a connection point of a gate of a PMOS and a gate of an NMOS in the GPIO circuit is a low level. In this embodiment of this application, whether the first detection circuit is configured to a pull-up circuit or a pull-down circuit may be specified based on different scenarios.

In this embodiment, when the processing module 802 determines the type of the inserted card based on at least the level of the at least first spring, a basis for the determining by the processing module 802 may be as follows: When a SIM card is inserted, a metal pin of the SIM card is electrically connected to the first spring and a spring adjacent to the first spring, and therefore a short circuit occurs between the first spring and the adjacent spring. This short-circuit phenomenon causes a level of the first spring to be different from a default level of the first spring (for example, this may be implemented by configuring the first detection circuit to a pull-up circuit or a pull-down circuit). If the processing module 802 determines that the level of the first spring is a default level, the processing module 802 may determine that the inserted card is a memory card. If the processing module 802 determines that the level of the first spring is not a default level, the processing module 802 may determine that the inserted card is a SIM card.

For example, the first detection circuit is set to a pull-down circuit, and the spring adjacent to the first spring is a VCC spring. In this case, when the SIM card is inserted into the card interface 801, a short circuit occurs between the first spring and the VCC spring, and the level of the first spring is pulled up to a high level from a low level configured by the pull-down circuit. When determining the high level of the first spring, the processing module 802 may determine that the inserted card is a SIM card.

For another example, the first detection circuit is set to a pull-up circuit, and the spring adjacent to the first spring is a GND spring. In this case, when the SIM card is inserted into the card interface 801, a short circuit occurs between the first spring and the GND spring, and the level of the first spring is pulled down to a low level from a high level configured by the pull-up circuit. When determining the low level of the first spring, the processing module 802 may determine that the inserted card is a SIM card.

As described above, the SIM card in this embodiment may be a nano SIM card (that is, M=6), and the memory card may be an SD card (that is, N=8). In this case, the electronic device 800 may further include a power interface, three analog switches, and six storage communications interfaces and three SIM communications interfaces that are connected to the processing module 802.

The power interface is electrically connected to a second spring used for connecting to a power supply in the N springs; first ends of the three analog switches are respectively connected to three of the N springs, and second ends of the three analog switches are respectively connected to three of the six storage communications interfaces through a switching operation or are respectively connected to the three SIM communications interfaces through a switching operation; and in the six storage communications interfaces other than the three storage communications interfaces, a first storage communications interface is connected to the first spring, a second storage communications interface is connected to a fourth spring in the N springs, and a third storage communications interface is connected to a fifth spring in the N springs.

In addition, the electronic device 800 may further include a ground interface, and the ground interface is electrically connected to a third spring used for grounding in the N springs.

In other words, when the six storage communications interfaces, the power interface, and the ground interface are separately communicatively connected to eight springs on the card interface 801, the electronic device 800 may implement a storage function. When three storage communications interfaces, the power interface, and the ground interface are separately communicatively connected to five springs on the card interface 801, the electronic device 800 may implement a user identification function.

In addition, when the electronic device 800 detects that a card is inserted, the power interface provides voltage, so that the card is powered on, and the processing module 802 determines the type of the inserted card based on the level of the first spring.

Figure 10:
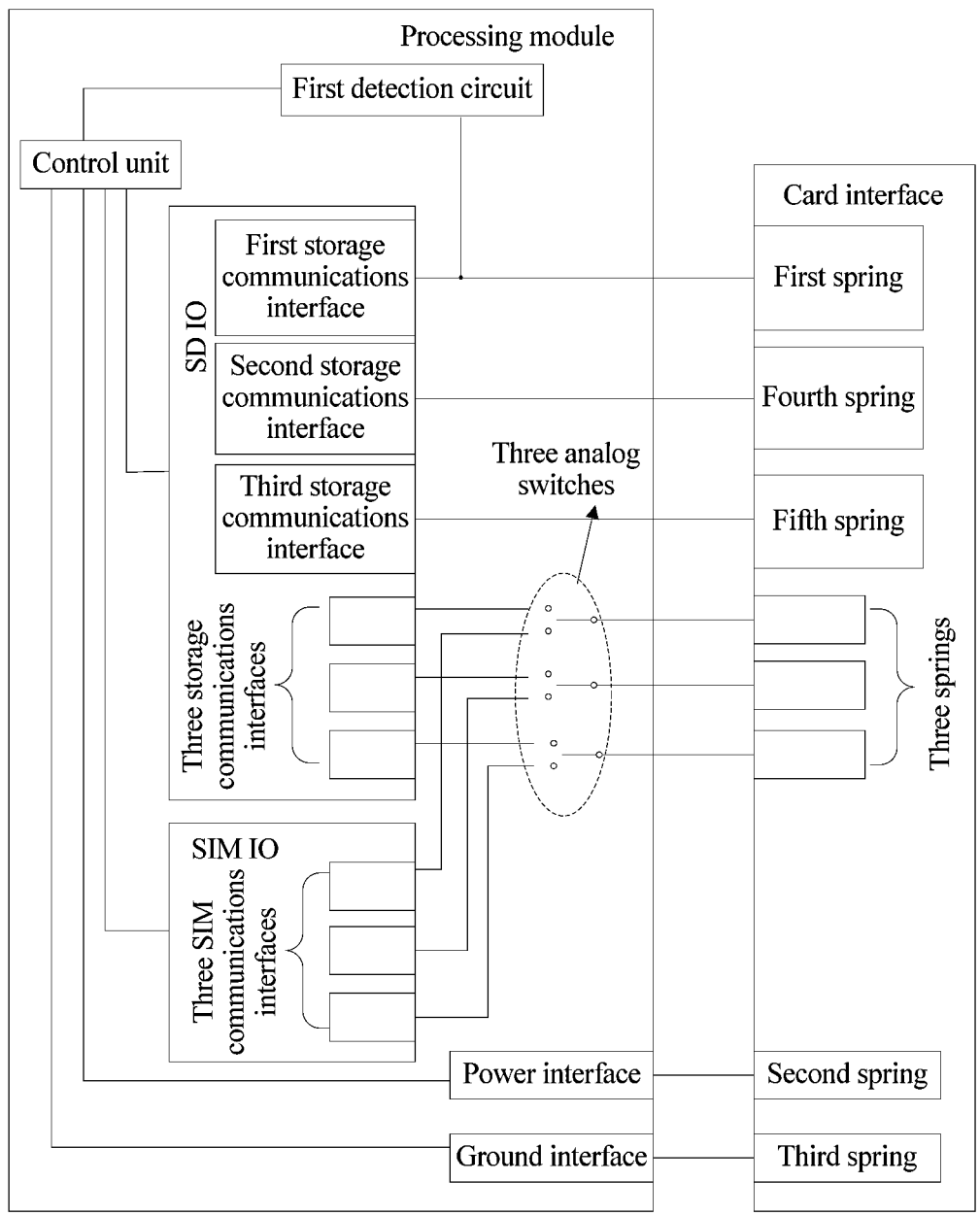
FIG. 10 is a second schematic structural diagram of an electronic device according to an embodiment of this application.

With reference to the foregoing description of composition of the electronic device 800, a possible structure of the electronic device 800 is shown in FIG. 10.

In FIG. 10, the card interface includes eight springs, and the first detection circuit is connected to the first spring to detect the level of the first spring when a card is inserted into the card interface. The processing module includes the control unit, SD IO, SIM IO, the power interface, and the ground interface. The power interface is connected to the second spring, and the ground interface is connected to the third spring. The processing module is connected to the control unit, and the control unit may be configured to control switching operations of the three analog switches. The processing module 802 is configured to determine, based on at least the level of the first spring, that the inserted card is a SIM card or a memory card. The SD IO includes the six storage communications interfaces, the SIM IO includes the three SIM communications interfaces, the first ends of the three analog switches are respectively connected to three of the N springs, and the second ends of the three analog switches are respectively connected to three of the six storage communications interfaces through a switching operation or are respectively connected to the three SIM communications interfaces through a switching operation.

In FIG. 10, when a memory card is inserted, the card interface is configured to implement communication between the processing module and the memory card by using the eight springs, and when a SIM card is inserted, the card interface is configured to implement communication between the processing module 802 and the SIM card by using the second spring, the third spring, and three springs. When the SIM card is inserted, a short circuit occurs between the first spring and a spring adjacent to the first spring and a short circuit occurs between the fourth spring and a spring adjacent to the fourth spring. In other words, a short circuit occurs between the first spring and the spring that is distributed on the card interface and that is adjacent to the first spring, and a short circuit occurs between the fourth spring and the spring that is distributed on the card interface and that is adjacent to the fourth spring.

In addition, if the electronic device has an NFC function, the electronic device may further include an NFC module and an NFC analog switch. A first end of the NFC analog switch is connected to the fifth spring, and a second end of the NFC analog switch is connected to the third storage communications interface through a switching operation or is connected to the NFC module through a switching operation. The NFC module is configured to implement the NFC function when the NFC module is connected to the NFC analog switch.

In the foregoing implementation, when determining that the inserted card is a SIM card, the processing module 802 may further control the second ends of the three analog switches to be respectively connected to the three SIM communications interfaces; and when determining that the inserted card is a memory card, the processing module 802 may further control the second ends of the three analog switches to be respectively connected to the three storage communications interfaces.

The processing module 802 may control switching of the three analog switches by using the control unit in the processing module 802.

Similarly, if the electronic device has the NFC function, when determining that the inserted card is a SIM card, the processing module 802 may further control the second end of the NFC analog switch to be connected to the NFC module; and when determining that the inserted card is a memory card, the processing module 802 may further control the second end of the NFC analog switch to be connected to the third storage communications interface.

According to the foregoing solution, after the type of the inserted card is identified, the card may be communicatively connected to the processing module 802 to implement a corresponding function.

The following describes implementations in which the processing module 802 determines, based on at least the level of the first spring, that the inserted card is a SIM card or a memory card.

Manner 1

If the first spring is adjacent to the second spring used for connecting to a power supply in the N springs, and a default level of the first spring is a low level (for example, the first detection circuit is configured to a pull-down circuit), when the first spring is at a high level, the processing module 802 determines that the inserted card is a SIM card; or when the first spring is at a low level, the processing module 802 determines that the inserted card is a memory card.

For a meaning of the case in which the first spring is adjacent to the second spring, refer to the foregoing description. That is, the first spring and the second spring are located on a same side of the card interface, and the first spring and the second spring are isolated by using only one insulation gap. Details are not described herein again.

In Manner 1, the default level of the first spring is a low level. The first spring is adjacent to the second spring (VCC spring), and a metal pin corresponding to the first spring and a metal pin corresponding to the second spring are obtained by splitting one metal pin of the SIM card. Therefore, when the SIM card is inserted into the card interface 801, one metal pin of the SIM card covers both the first spring and the second spring, a short circuit occurs between the first spring and the second spring, and a level of the first spring is pulled up to a high level by the second spring. When determining that the first spring is at a high level, the processing module 802 may determine that the inserted card is a SIM card.

Manner 2

If the first spring is adjacent to the third spring used for grounding in the N springs, and a default level of the first spring is a high level (for example, the first detection circuit is configured to a pull-up circuit), when the first spring is at a low level, the processing module 802 determines that the inserted card is a SIM card; or when the first spring is at a high level, the processing module 802 determines that the inserted card is a memory card.

In Manner 2, the default level of the first spring is a high level. The first spring is adjacent to the third spring (GND spring), and a metal pin corresponding to the first spring and a metal pin corresponding to the third spring are obtained by splitting one metal pin of the SIM card. Therefore, when the SIM card is inserted into the card interface 801, one metal pin of the SIM card covers both the first spring and the third spring, a short circuit occurs between the first spring and the third spring, and a level of the first spring is pulled down to a low level by the third spring. When determining that the first spring is at a low level, the processing module 802 may determine that the inserted card is a SIM card.

The foregoing Manner 1 and Manner 2 are solutions for identifying the type of the inserted card in a case in which the first spring is adjacent to the second spring (VCC spring) or is adjacent to the third spring (GND spring). In spring distribution of the card interface, if the first spring is adjacent to neither the second spring (VCC spring) nor the third spring (GND spring) (for example, in the metal pin distribution shown in FIG. 3, if the first spring is a spring corresponding to a D2 metal pin, the first spring is adjacent to neither the second spring nor the third spring), in this embodiment of this application, a default level of the spring adjacent to the first spring needs to be configured to help detect the level of the first spring, thereby helping the processing module 802 determine the type of the inserted card.

For example, a second detection circuit may be configured for the spring adjacent to the first spring, to configure the default level of the spring. The second detection circuit is connected to a spring that is in the N springs other than the first spring, the second spring, and the third spring and that is adjacent to the first spring, and an output state is configured for the second detection circuit.

The second detection circuit may also be a GPIO circuit. For a structure of the second detection circuit, refer to the first detection circuit shown in FIG. 9. As described above, an input state or an output state may be configured for the GPIO circuit. When an output state is configured for the GPIO circuit, the GPIO circuit may be configured to configure a level required by the circuit. Therefore, in this embodiment of this application, an output state is configured for the second detection circuit.

It should be noted that in the electronic device provided in this embodiment of this application, a plurality of detection circuits may be configured such as the first detection circuit and the second detection circuit above, and a third detection circuit, a fourth detection circuit, a fifth detection circuit, and a sixth detection circuit below. Implementation forms of these detection circuits are not limited in this embodiment of this application, provided that the detection circuits can detect a level of a spring or configure a default level of a spring. In addition, these detection circuits may be considered as a part of the processing module 802, or may be considered as circuits independent of the processing module 802.

Example implementations in which the processing module 802 determines, based on at least the level of the first spring, that the inserted card is a SIM card or a memory card may be shown in the following Manner 3 and Manner 4.

Manner 3

If the default level of the first spring is a low level, and the processing module 802 configures a default level of a spring adjacent to the first spring to a high level (for example, the second detection circuit is configured to a pull-up circuit), when the first spring is at a high level, the processing module 802 determines that the inserted card is a SIM card; or when the first spring is at a low level, the processing module 802 determines that the inserted card is a memory card.

In Manner 3, the default level of the first spring is a low level, and the default level of the spring adjacent to the first spring is a high level. A metal pin corresponding to the first spring and a metal pin corresponding to the adjacent spring are obtained by splitting one metal pin of the SIM card. Therefore, when the SIM card is inserted into the card interface 801, one metal pin of the SIM card covers both the first spring and the spring, a short circuit occurs between the first spring and the spring, and a level of the first spring is pulled up to a high level by the spring. When determining that the first spring is at a high level, the processing module 802 may determine that the inserted card is a SIM card.

Manner 4

If the default level of the first spring is a high level, and the processing module 802 configures a default level of a spring adjacent to the first spring to a low level (for example, the second detection circuit is configured to a pull-down circuit), when the first spring is at a low level, the processing module 802 determines that the inserted card is a SIM card; or when the first spring is at a high level, the processing module 802 determines that the inserted card is a memory card.

In Manner 4, the default level of the first spring is a high level, and the default level of the spring adjacent to the first spring is a low level. A metal pin corresponding to the first spring and a metal pin corresponding to the adjacent spring are obtained by splitting one metal pin of the SIM card. Therefore, when the SIM card is inserted into the card interface 801, one metal pin of the SIM card covers both the first spring and the spring, a short circuit occurs between the first spring and the spring, and a level of the first spring is pulled down to a low level by the spring. When determining that the first spring is at a low level, the processing module 802 may determine that the inserted card is a SIM card.

For the foregoing four manners, the following provides examples in which the processing module 802 determines the type of the card inserted into the card interface.

It is assumed that metal pin distribution of the memory card is shown in FIG. 5, and a system architecture is shown in FIG. 10. In this case, if the first spring is a spring corresponding to a D2 metal pin, statuses identified by the processing module may be shown in Table 3 when the SIM card and the memory card are separately inserted into the card interface.

TABLE 3

| | SIM card | | | Memory card | |
|---|---|---|---|---|---|
| Signal | Status | Type of the first detection circuit | Signal | Status | Type of the first detection circuit |
| D2 | H | Pull-down | D2 | L | Pull-down |

If the first spring is a spring corresponding to a D3 metal pin, statuses identified by the processing module 802 may be shown in Table 4 when the SIM card and the memory card are separately inserted into the card interface.

TABLE 4

| | SIM card | | | Memory card | |
|---|---|---|---|---|---|
| Signal | Status | Type of the first detection circuit | Signal | Status | Type of the first detection circuit |
| D3 | L | Pull-up | D3 | H | Pull-up |

It is assumed that metal pin distribution of the memory card is shown in FIG. 3, and a system architecture is shown in FIG. 10. If the first spring is a spring corresponding to a D2 metal pin, the second detection circuit may be disposed on a spring corresponding to a CLK metal pin. In this case, when the SIM card and the memory card are separately inserted into the card interface in different configurations of the first detection circuit and the second detection circuit, statuses identified by the processing module 802 may be shown in Table 5.

TABLE 5

| | SIM card | | | | Memory card | | |
|---|---|---|---|---|---|---|---|
| Signal | Status | Type of the first detection circuit | Type of the second detection circuit | Signal | Status | Type of the first detection circuit | Type of the second detection circuit |
| D2 | H | Pull-down | Pull-up | D2 | L | Pull-down | Pull-up |
| D2 | L | Pull-up | Pull-down | D2 | H | Pull-up | Pull-down |

As described above, the processing module 802 may determine the type of the inserted card based on the level of the first spring or based on a level of another spring. Therefore, in this embodiment of this application, in addition to detecting the level of the first spring, a level of the fourth spring in the at least one spring may be further detected.

For example, the level of the fourth spring may be detected by using a third detection circuit. The third detection circuit is connected to the fourth spring, and is configured to detect the level of the fourth spring when a card is inserted into the card interface 801. In this case, the processing module 802 may determine, based on the level of the fourth spring, that the inserted card is a SIM card or a memory card.

The third detection circuit may also be a GPIO circuit. For a structure of the third detection circuit, refer to the first detection circuit shown in FIG. 9.

Figure 11:
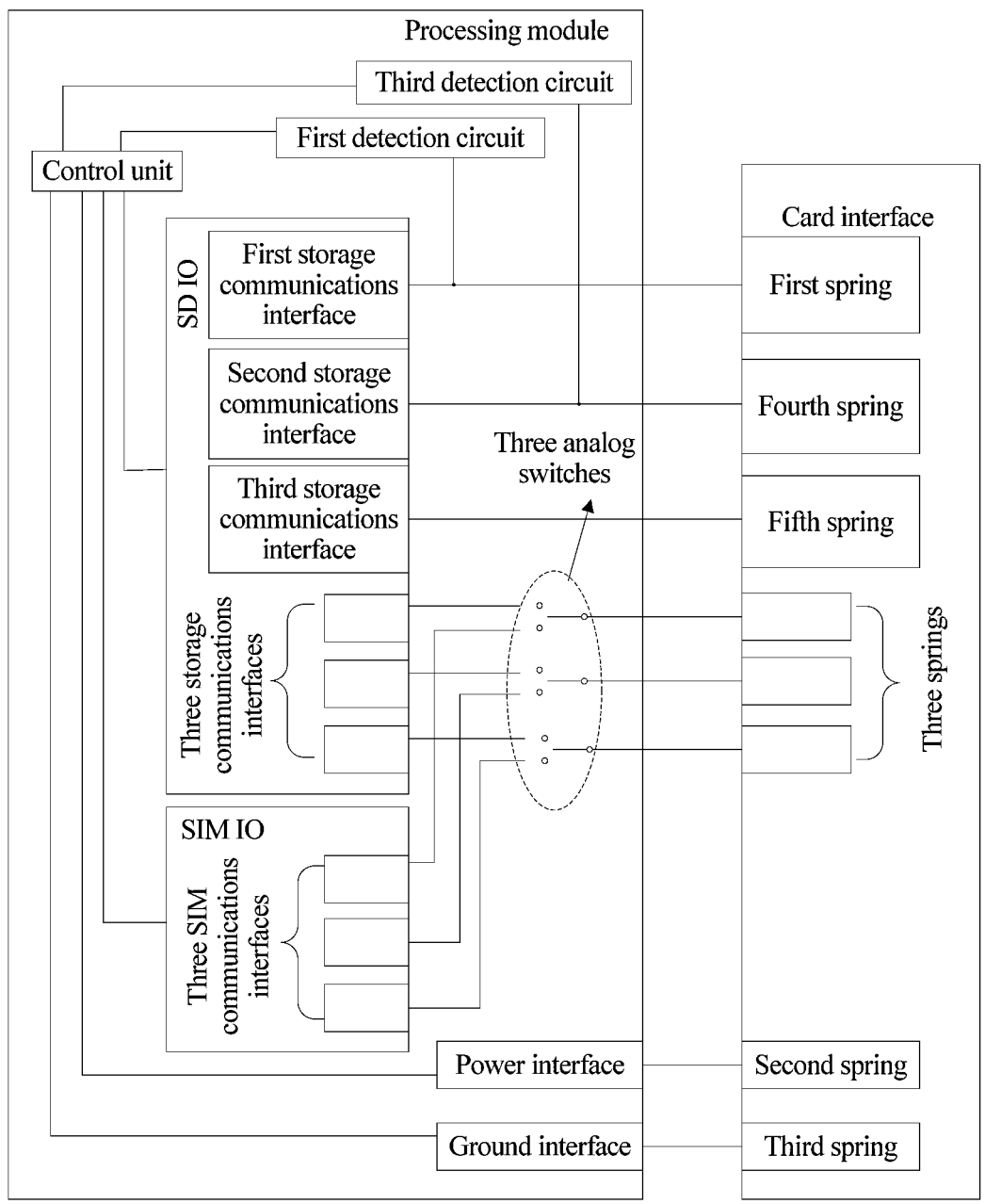
FIG. 11 is a third schematic structural diagram of an electronic device according to an embodiment of this application.

When the electronic device 800 includes the third detection circuit, a structure of the electronic device 800 shown in FIG. 10 may be shown in FIG. 11.

The third detection circuit is disposed, and the processing module 802 may determine the type of the inserted card based on the level of the fourth spring, so that the processing module 802 determines the card type more accurately.

In this embodiment of this application, when a SIM card is inserted, a short circuit occurs between the fourth spring and a spring adjacent to the fourth spring. A manner of detecting the level of the fourth spring and a manner of determining the type of the inserted card by the processing module 802 based on the level of the fourth spring are similar to those described above. For details, refer to the following four manners.

Manner 1

If the fourth spring is adjacent to the second spring used for connecting to a power supply in the N springs, and a default level of the fourth spring is a low level, when the fourth spring is at a high level, the processing module 802 determines that the inserted card is a SIM card; or when the fourth spring is at a low level, the processing module 802 determines that the inserted card is a memory card.

In Manner 1, the default level of the fourth spring is a low level. The fourth spring is adjacent to the second spring (VCC spring), and a metal pin corresponding to the fourth spring and a metal pin corresponding to the second spring are obtained by splitting one metal pin of the SIM card. Therefore, when the SIM card is inserted into the card interface 801, one metal pin of the SIM card covers both the fourth spring and the second spring, a short circuit occurs between the fourth spring and the second spring, and a level of the fourth spring is pulled up to a high level by the second spring. When determining that the fourth spring is at a high level, the processing module 802 may determine that the inserted card is a SIM card.

Manner 2

If the fourth spring is adjacent to the third spring used for grounding in the N springs, and a default level of the fourth spring is a high level, when the fourth spring is at a low level, the processing module 802 determines that the inserted card is a SIM card; or when the fourth spring is at a high level, the processing module 802 determines that the inserted card is a memory card.

In Manner 2, the default level of the fourth spring is a high level. The fourth spring is adjacent to the third spring (GND spring), and a metal pin corresponding to the fourth spring and a metal pin corresponding to the third spring are obtained by splitting one metal pin of the SIM card. There-fore, when the SIM card is inserted into the card interface 801, one metal pin of the SIM card covers both the fourth spring and the third spring, a short circuit occurs between the fourth spring and the third spring, and a level of the fourth spring is pulled down to a low level by the third spring. When determining that the fourth spring is at a low level, the processing module 802 may determine that the inserted card is a SIM card.

In spring distribution of the card interface, if the fourth spring is adjacent to neither the second spring (VCC spring) nor the third spring (GND spring), a default level of a spring adjacent to the fourth spring may be configured in this embodiment of this application, to help detect the level of the fourth spring.

For example, a fourth detection circuit may be configured for the spring adjacent to the fourth spring. The fourth detection circuit is connected to a spring that is in the N springs other than the second spring, the third spring, and the fourth spring and that is adjacent to the fourth spring, and an output state is configured for the fourth detection circuit.

The fourth detection circuit may also be a GPIO circuit. For a structure of the fourth detection circuit, refer to the first detection circuit shown in FIG. 9. As described above, an input state or an output state may be configured for the GPIO circuit. When an output state is configured for the GPIO circuit, the GPIO circuit may be configured to configure a level required by the circuit. Therefore, in this embodiment of this application, an output state is configured for the fourth output circuit.

Example implementations in which the processing module 802 determines, based on the level of the fourth spring, that the inserted card is a SIM card or a memory card may be shown in the following Manner 3 and Manner 4.

Manner 3

If the default level of the fourth spring is a low level, and the processing module 802 configures a default level of a spring adjacent to the fourth spring to a high level (for example, the fourth detection circuit is configured to a pull-up circuit), when the fourth spring is at a high level, the processing module 802 determines that the inserted card is a SIM card; or when the fourth spring is at a low level, the processing module 802 determines that the inserted card is a memory card.

In Manner 3, the default level of the fourth spring is a low level, and the default level of the spring adjacent to the fourth spring is a high level. A metal pin corresponding to the fourth spring and a metal pin corresponding to the adjacent spring are obtained by splitting one metal pin of the SIM card. Therefore, when the SIM card is inserted into the card interface 801, one metal pin of the SIM card covers both the fourth spring and the spring, a short circuit occurs between the fourth spring and the adjacent spring, and a level of the fourth spring is pulled up to a high level by the spring. When determining that the fourth spring is at a high level, the processing module 802 may determine that the inserted card is a SIM card.

Manner 4

If the default level of the fourth spring is a high level, and the processing module 802 configures a default level of a spring adjacent to the fourth spring to a low level (for example, the fourth detection circuit is configured to a pull-down circuit), when the fourth spring is at a low level, the processing module 802 determines that the inserted card is a SIM card; or when the fourth spring is at a high level, the processing module 802 determines that the inserted card is a memory card.

In Manner 4, the default level of the fourth spring is a high level, and the default level of the spring adjacent to the fourth spring is a low level. A metal pin corresponding to the fourth spring and a metal pin corresponding to the adjacent spring are obtained by splitting one metal pin of the SIM card. Therefore, when the SIM card is inserted into the card interface 801, one metal pin of the SIM card covers both the fourth spring and the spring, a short circuit occurs between the fourth spring and the spring, and a level of the fourth spring is pulled down to a low level by the spring. When determining that the fourth spring switches from a high level to a low level, the processing module 802 may determine that the inserted card is a SIM card.

After determining the type of the card inserted into the card interface 801, the electronic device provided in this embodiment of this application may further detect a level of a spring on the card interface 801 if the inserted card is a SIM card, to determine whether the SIM card is abnormal. The anomaly described herein is usually an anomaly caused when a cutting tolerance of the SIM card is excessively large.

In actual use, a user may cut an existing micro SIM card, and use the cut micro SIM card as a nano SIM card. After the cutting, the SIM card cannot be used if a cutting tolerance is excessively large. This embodiment of this application provides the following solution for detecting a SIM card anomaly caused by cutting.

In this embodiment, the processing module 802 is further configured to configure a default level of a first specified spring that is in the N springs other than the first spring and that is adjacent to the second spring used for connecting to a power supply in the N springs to a low level.

A level of the first specified spring is detected, so that the processing module 802 can determine an anomaly of the SIM card.

For example, a fifth detection circuit may be disposed for the first specified spring to detect the level of the first specified spring. The fifth detection circuit is connected to the first specified spring that is in the N springs other than the first spring and that is adjacent to the second spring, the fifth detection circuit is configured to detect and output the level of the first specified spring, and the fifth detection circuit is configured to a pull-down circuit (that is, the default level of the first specified spring is a low level).

The fifth detection circuit may also be a GPIO circuit. For a structure of the fifth detection circuit, refer to the first detection circuit shown in FIG. 9.

The first specified spring may be any spring that is in the N springs other than the first spring and that is adjacent to the second spring. For example, in the metal pin distribution shown in FIG. 5, if a spring corresponding to a D2 metal pin is the first spring, a spring corresponding to a D0 metal pin may be considered as the first specified spring.

After configuring the default level of the first specified spring, the processing module 802 may detect an abnormal state of the SIM card in the following three manners.

Manner 1

If the first spring is adjacent to the second spring used for connecting to a power supply in the N springs, and the default level of the first spring is a low level, when the first spring is at a low level and the first specified spring is at a high level, the processing module 802 determines that a short circuit occurs between the second spring and the first specified spring and an open circuit occurs between the second spring and the first spring.

The first spring is adjacent to the second spring, and the first specified spring is also adjacent to the second spring.

When a SIM card of a normal size is inserted, a VCC metal pin used for connecting to a power supply in the SIM card covers the first spring and the second spring (that is, when a memory card is inserted, a metal pin corresponding to the first spring and a metal pin corresponding to the second spring are two metal pins obtained after the VCC metal pin is split), thereby causing a short circuit between the first spring and the second spring. In this case, when a cut SIM card is inserted, misplacement between a metal pin in the SIM card and a spring on the card interface may be caused due to a cutting tolerance of the SIM card, and consequently a level of the first spring and a level of the first specified spring are abnormal.

In Manner 1, the first spring is at a low level and the first specified spring is at a high level. In other words, because of an error in cutting the SIM card, the second spring is connected to a metal pin corresponding to the first specified spring in the SIM card and is disconnected from the metal pin corresponding to the first spring. In this case, the first spring is at a low level and the first specified spring is at a high level. The processing module 802 may determine, based on the level of the first spring and the level of the first specified spring, that a short circuit occurs between the second spring and the first specified spring and an open circuit occurs between the second spring and the first spring.

Figure 12:
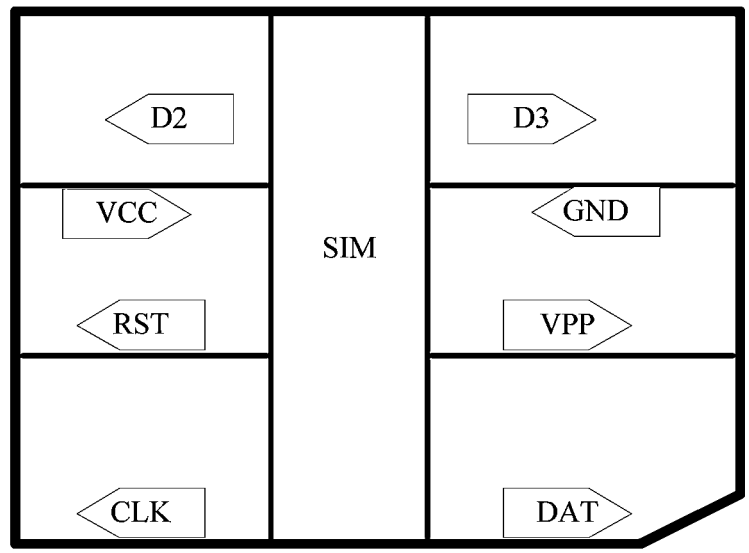
FIG. 12 is a first schematic diagram of an abnormal state of a SIM card according to an embodiment of this application.

For example, for description of the abnormal state in Manner 1, refer to FIG. 12. In FIG. 12, the SIM card includes three metal pins on the left and three metal pins on the right, D2 is the first spring on the card interface 801, VCC is the second spring on the card interface 801, and RST is the first specified spring on the card interface 801. When the SIM card is inserted into the card interface 801, the VCC spring is connected to a metal pin corresponding to the RST spring in the SIM card and is disconnected from a metal pin corresponding to the D2 spring.

For ease of description, this abnormal state of the SIM card is referred to as "spring misplacement" in this embodiment of this application.

Manner 2

If the first spring is adjacent to the second spring used for connecting to a power supply in the N springs, and the default level of the first spring is a low level, when the first spring is at a low level and the first specified spring is at a low level, the processing module 802 determines that an open circuit occurs between the second spring and the first specified spring and an open circuit occurs between the second spring and the first spring.

In Manner 2, the first spring is at a low level and the first specified spring is at a low level. In other words, because of an error in cutting the SIM card, the second spring is disconnected from a metal pin corresponding to the first specified spring in the SIM card and is also disconnected from the metal pin corresponding to the first spring, and the second spring is connected to an insulation gap between metal pins in the SIM card. In this case, both the first spring and the first specified spring are at a low level. The processing module 802 may determine, based on the level of the first spring and the level of the first specified spring, that an open circuit occurs between the second spring and the first specified spring and an open circuit occurs between the second spring and the first spring.

Figure 13:
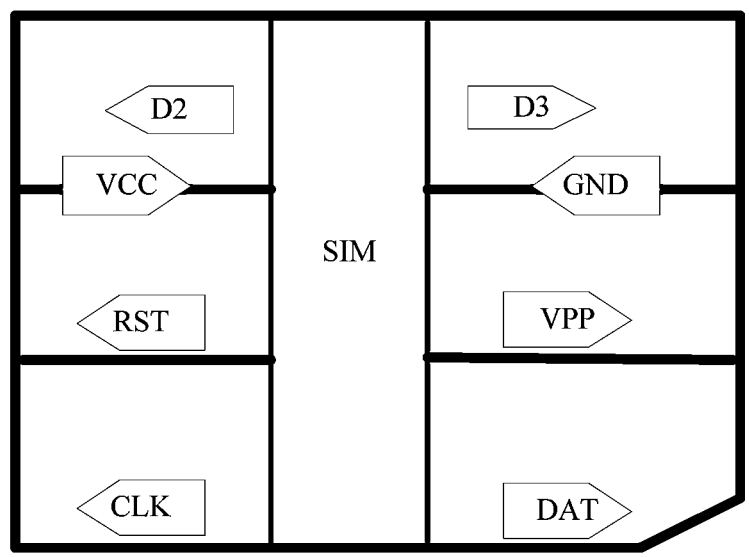
FIG. 13 is a second schematic diagram of an abnormal state of a SIM card according to an embodiment of this application.

For example, for description of the abnormal state in Manner 2, refer to FIG. 13. In FIG. 13, the SIM card includes three metal pins on the left and three metal pins on the right, D2 is the first spring on the card interface 801, VCC is the second spring on the card interface 801, and RST is the first specified spring on the card interface 801. When the SIM card is inserted into the card interface 801, the VCC spring is disconnected from a metal pin corresponding to the RST spring in the SIM card and is also disconnected from a metal pin corresponding to the D2 spring.

For ease of description, this abnormal state of the SIM card is referred to as a "critical open circuit" in this embodiment of this application.

Manner 3

If the first spring is adjacent to the second spring used for connecting to a power supply in the N springs, and the default level of the first spring is a low level, when the first spring is at a high level and the first specified spring is at a high level, the processing module 802 determines that a short circuit occurs between the second spring and the first specified spring and a short circuit occurs between the second spring and the first spring.

In Manner 3, the first spring is at a high level and the first specified spring is at a high level. In other words, because of an error in cutting the SIM card, the second spring is connected to a metal pin corresponding to the first specified spring in the SIM card and is also connected to the metal pin corresponding to the first spring. In this case, both the first spring and the first specified spring are at a high level. The processing module 802 may determine, based on the level of the first spring and the level of the first specified spring, that a short circuit occurs between the second spring and the first specified spring and a short circuit occurs between the second spring and the first spring.

Figure 14:
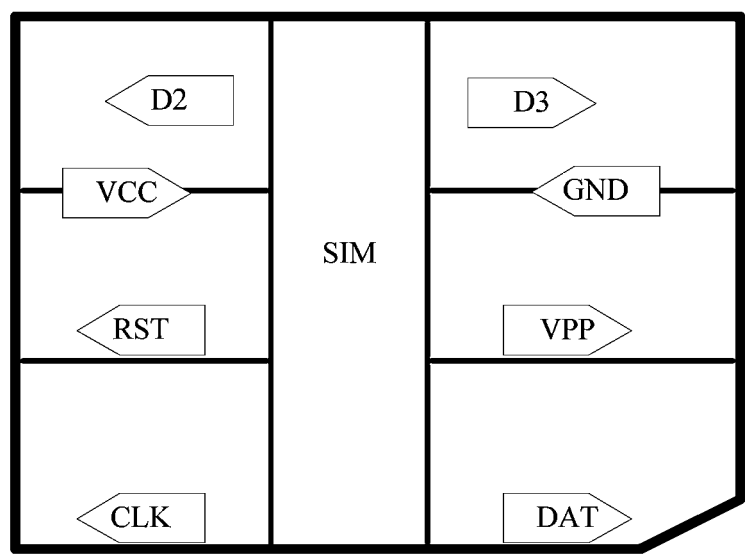
FIG. 14 is a third schematic diagram of an abnormal state of a SIM card according to an embodiment of this application.

For example, for description of the abnormal state in Manner 3, refer to FIG. 14. In FIG. 14, the SIM card includes three metal pins on the left and three metal pins on the right, D2 is the first spring on the card interface 801, VCC is the second spring on the card interface 801, and RST is the first specified spring on the card interface 801. When the SIM card is inserted into the card interface 801, the VCC spring is connected to a metal pin corresponding to the RST spring in the SIM card and is also connected to a metal pin corresponding to the D2 spring.

For ease of description, this abnormal state of the SIM card is referred to as a "critical short circuit" in this embodiment of this application.

For the abnormal state in Manner 1 and the abnormal state in Manner 2, in this embodiment of this application, the processing module 802 may control the power interface to be conducted to the first storage communications interface, and control the ground interface to be conducted to the second storage communications interface, to eliminate the foregoing two abnormal states. The first storage communications interface is connected to the first spring, the second storage communications interface is connected to the fourth spring in the N springs, and the fourth spring and the first spring are symmetrically distributed on the card interface.

The power interface is conducted to the first storage communications interface to change a level of the first spring on the card interface 801 to a high level, so that the SIM card is powered on. In addition, the ground interface is conducted to the second storage communications interface to change a level of the fourth spring on the card interface 801 to a low level, so that the SIM card is grounded.

It should be noted herein that, in metal pin distribution of the SIM card, usually, a VCC metal pin and a GND metal pin are symmetrically located on the left side and the right side. For example, in the SIM card shown in FIG. 1, the VCC metal pin is located in the third position on the left side, and the GND metal pin is located in the third position on the right side. Therefore, when a cutting tolerance of the SIM card is excessively large, a level anomaly not only occurs on a spring adjacent to the VCC metal pin, but also occurs on a spring adjacent to the GND metal pin. (For example, in FIG. 12, a level of a D3 spring and a level of a VPP spring may also be abnormal). Therefore, when an abnormal state is being eliminated, not only the power interface and the first storage communications interface need to be conducted, but also the ground interface and the second storage communications interface need to be conducted.

In addition, when the abnormal state is being eliminated, the second communications interface is selected to be conducted to the ground interface for the following consideration: Because metal springs on the card interface are symmetrical, and both the first spring and the fourth spring are only springs of a memory card for transmitting information, the first spring and the fourth spring are usually symmetrically distributed on both sides of the card interface, for example, the D2 spring and the D3 spring in FIG. 12. If the first spring is adjacent to the second spring (VCC spring), the fourth spring is usually adjacent to the third spring (GND spring). Therefore, when the foregoing two abnormal states are caused because a cutting tolerance of the SIM card is excessively large, it may be considered that the second communications interface is selected to be conducted to the ground interface, so that the SIM card is grounded.

The abnormal state in Manner 3 cannot be recovered by the processing module 802 in this embodiment of this application. In this case, the processing module 802 may generate first user prompt information, where the first user prompt information is used to notify a user that the SIM card is abnormal, that is, the user is notified that a cutting tolerance of the SIM card is excessively large, and consequently the SIM card cannot be used.

With reference to the foregoing description of various abnormal states, the following provides examples in which the processing module 802 determines an abnormal state based on a level.

It is assumed that metal pin distribution of the memory card is shown in FIG. 5, and a system architecture is shown in FIG. 10. D2 is the first spring on the card interface 801, GND is the third spring on the card interface 801, and RST is the first specified spring on the card interface 801. In this case, level of each spring in an abnormal state and a normal state may be shown in Table 6.

TABLE 6

|  | Signal | Status | Detection circuit configuration |
|---|---|---|---|
| Normal state | RST | L | Pull-down |
|  | D2 | H | Pull-down |
| Spring misplacement | RST | H | Pull-down |
|  | D2 | L | Pull-down |
| Critical short circuit | RST | H | Pull-down |
|  | D2 | H | Pull-down |
| Critical open circuit | RST | L | Pull-down |
|  | D2 | L | Pull-down |

It should be noted that, to enable the processing module 802 to more accurately determine the type of the inserted card, a plurality of detection circuits may be disposed in the electronic device 800 to detect level of different springs.

For example, if the abnormal state shown in Table 6 appears in actual implementation, the type of the inserted card may not be accurately determined by detecting only a level of the D2 spring. For example, when a memory card is inserted in a normal state, the D2 spring is at a low level. However, when a SIM card is inserted, and the SIM card is in an abnormal state such as spring misplacement or a critical open circuit, the D2 spring is also at a low level. In this case, it is obviously incorrect to determine that the inserted card is a memory card. That is, an error in determining the card type may occur if only the level of the D2 spring is detected. Therefore, another detection circuit may be disposed in the electronic device 800 to detect a level of an RST spring. Therefore, the processing module 802 may determine the type of the inserted card and the abnormal state of the SIM card with reference to the level of the RST spring and the level of the D2 spring.

In addition, whether the SIM card is abnormal may be further determined by detecting a level of a spring adjacent to the third spring (GND spring).

In this embodiment of this application, the processing module 802 is further configured to configure a default level of a second specified spring that is in the N springs other than the first spring and that is adjacent to the third spring used for grounding in the N springs to a high level.

A level of the second specified spring is detected, so that the processing module 802 can determine an anomaly of the SIM card.

For example, a sixth detection circuit may be disposed for the second specified spring. The sixth detection circuit is connected to the second specified spring that is in the N springs other than the first spring and that is adjacent to the third spring, the fifth detection circuit is configured to detect and output the level of the second specified spring, and the sixth detection circuit is configured to a pull-up circuit (that is, the default level of the second specified spring is a high level).

The sixth detection circuit may also be a GPIO circuit. For a structure of the sixth detection circuit, refer to the first detection circuit shown in FIG. 9.

After configuring the default level of the second specified spring, the processing module 802 may detect the abnormal state of the SIM card in the following three manners.

Manner 1

If the first spring is adjacent to the third spring used for grounding in the N springs, and the default level of the first spring is a high level, when the first spring is at a high level and the second specified spring is at a low level, the processing module 802 determines that a short circuit occurs between the third spring and the second specified spring and an open circuit occurs between the third spring and the first spring.

In Manner 1, the first spring is at a high level and the second specified spring is at a low level. In other words, because of an error in cutting the SIM card, the third spring is connected to a metal pin corresponding to the second specified spring in the SIM card and is disconnected from the metal pin corresponding to the first spring. In this case, the first spring is at a high level and the second specified spring is at a low level. The processing module 802 may determine, based on the level of the first spring and the level of the second specified spring, that a short circuit occurs between the third spring and the second specified spring and an open circuit occurs between the third spring and the first spring.

For example, for description of the abnormal state in Manner 1, refer to FIG. 12. In FIG. 12, the SIM card includes three metal pins on the left and three metal pins on the right, D3 is the first spring on the card interface 801, GND is the third spring on the card interface 801, and VPP is the second specified spring on the card interface 801. When the SIM card is inserted into the card interface 801, the GND spring is connected to a metal pin corresponding to the VPP spring in the SIM card and is disconnected from a metal pin corresponding to the D3 spring.

For ease of description, this abnormal state of the SIM card is referred to as "spring misplacement" in this embodiment of this application.

Manner 2

If the first spring is adjacent to the third spring used for grounding in the N springs, and the default level of the first spring is a high level, when the first spring is at a high level and the second specified spring is at a high level, the processing module 802 determines that an open circuit occurs between the third spring and the second specified spring and an open circuit occurs between the third spring and the first spring.

In Manner 2, the first spring is at a high level and the second specified spring is at a high level. In other words, because of an error in cutting the SIM card, the third spring is disconnected from a metal pin corresponding to the second specified spring in the SIM card and is also disconnected from the metal pin corresponding to the first spring, and the third spring is connected to an insulation gap between metal pins in the SIM card. In this case, both the first spring and the second specified spring are at a high level. The processing module 802 may determine, based on the level of the first spring and the level of the second specified spring, that an open circuit occurs between the third spring and the second specified spring and an open circuit occurs between the third spring and the first spring.

For example, for description of the abnormal state in Manner 2, refer to FIG. 13. In FIG. 13, the SIM card includes three metal pins on the left and three metal pins on the right, D3 is the first spring on the card interface 801, GND is the third spring on the card interface 801, and VPP is the second specified spring on the card interface 801. When the SIM card is inserted into the card interface 801, the GND spring is disconnected from a metal pin corresponding to the VPP spring in the SIM card and is also disconnected from a metal pin corresponding to the D3 spring.

For ease of description, this abnormal state of the SIM card is referred to as a "critical open circuit" in this embodiment of this application.

Manner 3

If the first spring is adjacent to the third spring used for grounding in the N springs, and the default level of the first spring is a high level, when the first spring is at a low level and the second specified spring is at a low level, the processing module 802 determines that a short circuit occurs between the third spring and the second specified spring and a short circuit occurs between the third spring and the first spring.

In Manner 3, the first spring is at a low level and the second specified spring is at a low level. In other words, because of an error in cutting the SIM card, the third spring is connected to a metal pin corresponding to the second specified spring in the SIM card and is also connected to the metal pin corresponding to the first spring. In this case, both the first spring and the second specified spring are at a low level. The processing module 802 may determine, based on the level of the first spring and the level of the second specified spring, that a short circuit occurs between the third spring and the second specified spring and a short circuit occurs between the third spring and the first spring.

For example, for description of the abnormal state in Manner 3, refer to FIG. 14. In FIG. 14, the SIM card includes three metal pins on the left and three metal pins on the right, D3 is the first spring on the card interface 801, GND is the third spring on the card interface 801, and VPP is the second specified spring on the card interface 801. When the SIM card is inserted into the card interface 801, the GND spring is connected to a metal pin corresponding to the VPP spring in the SIM card and is also connected to a metal pin corresponding to the D3 spring.

For ease of description, this abnormal state of the SIM card is referred to as a "critical short circuit" in this embodiment of this application.

Similarly, for the abnormal state in Manner 1 and the abnormal state in Manner 2, in this embodiment of this application, the processing module 802 may control the power interface to be conducted to the first storage communications interface, and control the ground interface to be conducted to the second storage communications interface, to eliminate the foregoing two abnormal states. The first storage communications interface is connected to the first spring, the second storage communications interface is connected to the fourth spring in the N springs, and the fourth spring and the first spring are symmetrically distributed on the card interface.

The abnormal state in Manner 3 cannot be recovered by software in this embodiment of this application. In this case, the processing module 802 may generate second user prompt information, where the second user prompt information is used to notify the user that the SIM card is abnormal, that is, the user is notified that a cutting tolerance of the SIM card is excessively large, and consequently the SIM card cannot be used.

With reference to the foregoing description of various abnormal states, the following provides examples in which the processing module 802 determines an abnormal state based on a level.

It is assumed that metal pin distribution of the memory card is shown in FIG. 5, and a system architecture is shown in FIG. 10. D3 is the first spring on the card interface 801, GND is the third spring on the card interface 801, and VPP is the second specified spring on the card interface 801. In this case, level of each spring in an abnormal state and a normal state may be shown in Table 7.

TABLE 7

|  | Signal | Status | Detection circuit configuration |
|---|---|---|---|
| Normal state | VPP | H | Pull-up |
|  | D3 | L | Pull-up |
| Spring misplacement | VPP | L | Pull-up |
|  | D3 | H | Pull-up |
| Critical short circuit | VPP | L | Pull-up |
|  | D3 | L | Pull-up |
| Critical open circuit | VPP | H | Pull-up |
|  | D3 | H | Pull-up |

It should be noted that, to enable the processing module 802 to more accurately determine the type of the inserted card, a plurality of detection circuits may be disposed in the electronic device 800 to detect level of different springs.

For example, if the abnormal state shown in Table 6 appears in actual implementation, the type of the inserted card may not be accurately determined by detecting only a level of the D3 spring. For example, when a memory card is inserted in a normal state, the D3 spring is at a high level. However, when a SIM card is inserted, and the SIM card is in an abnormal state such as spring misplacement or a critical open circuit, the D3 spring is also at a high level. In this case, it is obviously incorrect to determine that the inserted card is a memory card. That is, an error in determining the card type may occur if only the level of the D3 spring is detected. Therefore, another detection circuit may be disposed in the electronic device 800 to detect a level of a VPP spring. Therefore, the processing module 802 may determine the type of the inserted card and the abnormal state of the SIM card with reference to the level of the VPP spring and the level of the D3 spring.

In this embodiment of this application, the electronic device includes the card interface and the processing module. When a memory card is inserted into the card interface, the memory card is electrically connected to the processing module to implement a storage function of the electronic device. When a SIM card is inserted into the card interface, the SIM card is electrically connected to the processing module, and one metal pin of the SIM card is electrically connected to the first spring in the N springs and one spring adjacent to the first spring. The processing module determines, based on at least the level of the first spring, that the inserted card is a SIM card or a memory card. When a SIM card is inserted, a short circuit occurs between the first spring and the adjacent spring, and the short-circuit phenomenon causes a current level of the first spring to be different from the default level. If the processing module determines that the level of the first spring is the default level, the processing module may determine that the inserted card is a memory card. If the processing module determines that the level of the first spring is not the default level, the processing module may determine that the inserted card is a SIM card.

In addition, in this embodiment of this application, the type of the inserted card may be alternatively identified in a manner of performing assumption first and then sequentially performing trial and error. When it is detected that a card is inserted into a card holder, it is first assumed that the inserted card is a SIM card, and card information is read through a SIM card initialization operation. If the reading succeeds, the inserted card is identified as a SIM card. If the reading fails, it is assumed that the inserted card is a memory card, and the card information is read through a memory card initialization operation. If the reading succeeds, the inserted card is identified as is a memory card. If the reading fails again, it is determined that no card is inserted or the card is invalid.

Based on the foregoing manner of performing assumption first and then sequentially performing trial and error, an embodiment of this application provides an electronic device, and the electronic device includes a card interface and a processing module. The card interface is electrically connected to the processing module, and a SIM card or a memory card may be inserted into the card interface. The card interface includes N springs, where N>1; when a memory card is inserted into the card interface, the memory card is electrically connected to the processing module; and when a SIM card is inserted into the card interface, the SIM card is electrically connected to the processing module.

The processing module is configured to: perform, through a SIM card initialization procedure, a first initialization operation on a card inserted into the card interface; and if the first initialization operation succeeds, determine that the card inserted into the card interface is a SIM card; or if the first initialization operation fails, perform, through a memory card initialization procedure, a second initialization operation on the card inserted into the card interface, and if the second initialization operation succeeds, determine that the card inserted into the card interface is a memory card, or if the second initialization operation fails, determine that no card is inserted into the card interface or the card inserted into the card interface is invalid.

Similarly, a type of the inserted card may be alternatively identified in a manner of performing memory card initialization first and then performing SIM initialization.

Therefore, an embodiment of this application provides an electronic device, and the electronic device includes a card interface and a processing module. The card interface is electrically connected to the processing module, and a SIM card or a memory card may be inserted into the card interface. The card interface includes N springs, where N>1; when a memory card is inserted into the card interface, the memory card is electrically connected to the processing module; and when a SIM card is inserted into the card interface, the SIM card is electrically connected to the processing module.

The processing module is configured to: perform, through a memory card initialization procedure, a third initialization operation on a card inserted into the card interface; and if the third initialization operation succeeds, determine that the card inserted into the card interface is a memory card; or if the third initialization operation fails, perform, through a SIM card initialization procedure, a fourth initialization operation on the card inserted into the card interface, and if the fourth initialization operation succeeds, determine that the card inserted into the card interface is a SIM card, or if the fourth initialization operation fails, determine that no card is inserted into the card interface or the card inserted into the card interface is invalid. According to the foregoing solution, a type of the inserted card may be determined by determining whether the inserted card can be initialized through a corresponding initialization operation.

In addition, the foregoing manner of performing assumption first and then sequentially performing trial and error may be combined with the manner in which the processing module 802 in the electronic device 800 shown in FIG. 8 determines the type of the inserted card. For example, if the processing module 802 first determines that the card inserted into the card interface 801 is a SIM card in a manner of identifying a level, and then reads card information through a SIM card initialization operation. If the reading succeeds, it is determined that the card inserted into the card interface 801 is a SIM card. Alternatively, the processing module 802 first determines that the card inserted into the card interface 801 is a memory card in a manner of identifying a level, and then reads card information through a memory card initialization operation. If the reading succeeds, it is determined that the card inserted into the card interface 801 is a memory card.

In this embodiment of this application, the processing module may identify, based on a level of each spring, the type of the card inserted into the card interface 801, and detect the abnormal state of the SIM card. When the detected abnormal state is a recoverable abnormal state (such as spring misplacement or a critical open circuit), the foregoing abnormal state can be eliminated by controlling a conduction relationship of a communications interface. The user may be notified when the detected abnormal state is an unrecoverable abnormal state (such as a critical short circuit).

Figure 15A:
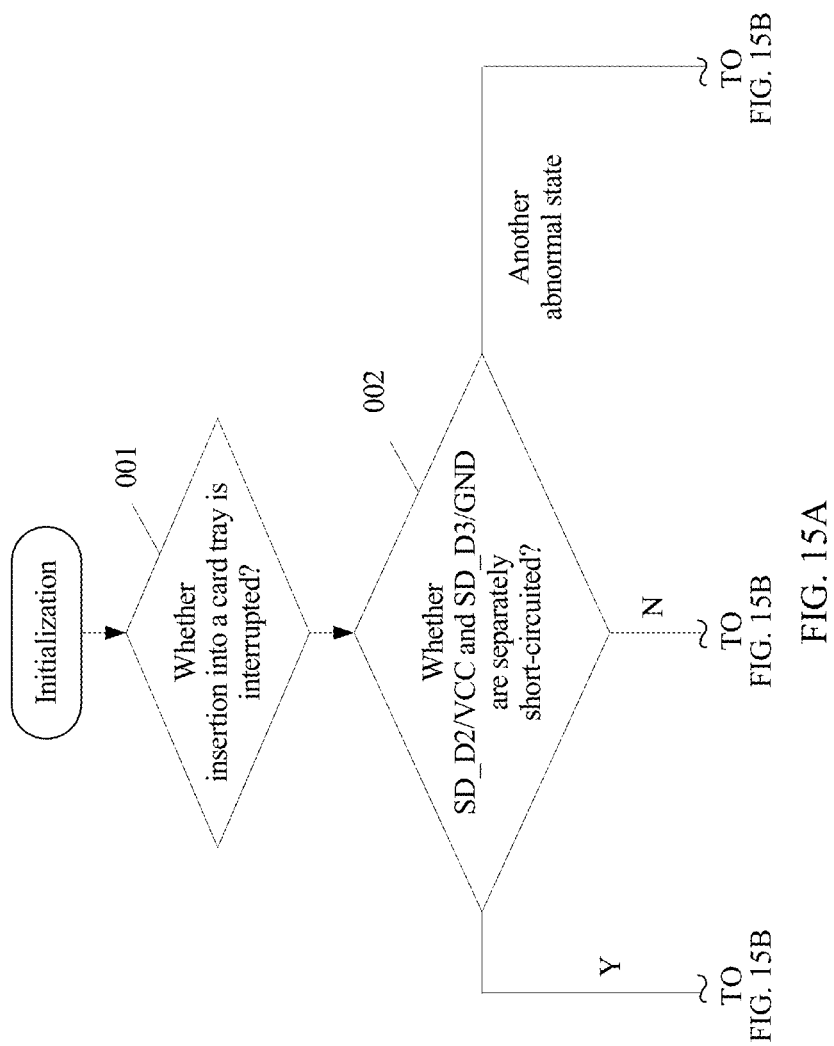
FIG. 15A and FIG. 15B are a schematic flowchart of operations performed by a processing module according to an embodiment of this application.
Figure 15B:
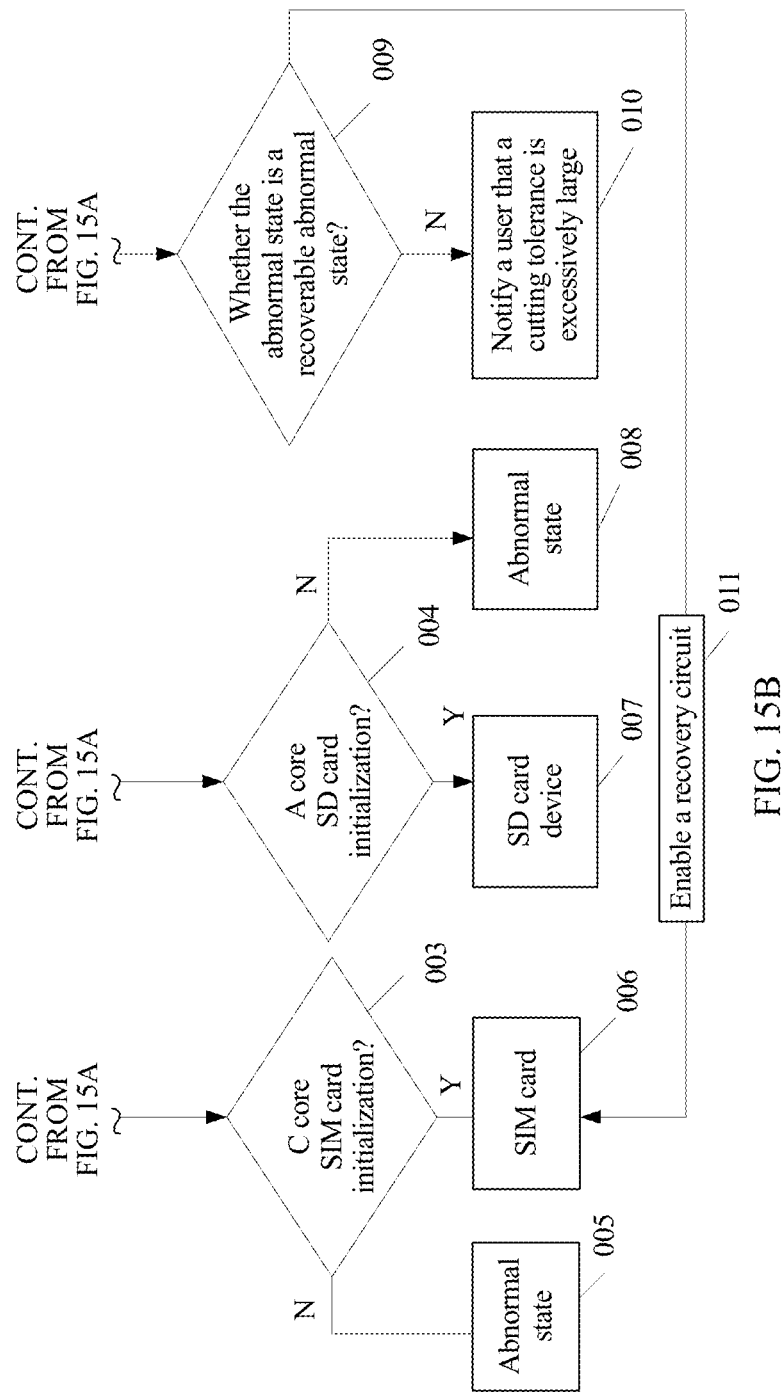

With reference to the foregoing functions of the processing module, in this embodiment of this application, a flowchart of operations performed by the processing module may be shown in FIG. 15A and FIG. 15B. In FIG. 15A and FIG. 15B, the processing module performs the following steps:

(1) Detect that a card is inserted into a card interface.

(2) Determine whether the inserted card is a SIM card or a nano SD card by determining statuses of IO interfaces such as SD_D2/VCC and SD_D3/GND. If the inserted card is a SIM card, go to step 3; if the inserted card is a nano SD card, go to step 4; or if an abnormal state is detected, go to step 9.

SD_D2 may be considered as an example of a first spring, VCC may be considered as an example of a second spring, SD_D3 may be considered as an example of a fourth spring, and GND may be considered as an example of a third spring.

For a determining manner in step 2, refer to the related description of the electronic device 800.

(3) When a SIM card is detected, start to perform SIM card initialization. If the SIM card initialization is abnormal, go to step 5; or if the SIM card initialization is normal, go to step 5.

(4) When a nano SD is detected, start to perform nano SD card initialization. If the nano SD card initialization is normal, go to step 7; or if the nano SD card initialization is abnormal, go to step 8.

(5) The SIM initialization is abnormal.

(6) A function of the SIM card is normal.

(7) A function of the SD card is normal.

(8) A function of the SD card is abnormal.

(9) Detect whether the abnormal state is a recoverable abnormal state. If the abnormal state is a recoverable abnormal state, go to step 11; or if the abnormal state is an unrecoverable abnormal state, go to step 10.

(10) If an unrecoverable abnormal phenomenon is caused because a cutting tolerance of a nano SIM card is excessively large, notify a user of this phenomenon.

(11) Enable an anomaly recovery circuit for a recoverable abnormal phenomenon, and after the recovery, go to step 6 to start SIM card initialization.

It should be noted that FIG. 15A and FIG. 15B are example operations performed by the processing module 802 in the electronic device 800. For an implementation that is not described in detail in the procedure shown in FIG. 15A and FIG. 15B, refer to the related description of the electronic device 800 shown in FIG. 8.

Based on the foregoing embodiment, an embodiment of this application further provides a computer storage medium. The storage medium stores a software program, and when being read and executed by one or more processing modules, the software program can implement the method performed by the processing module 802 provided in the foregoing embodiment.

In view of the above, an embodiment of this application provides an electronic device. According to the electronic device provided in this embodiment of this application, when a card is inserted into a card interface of the electronic device, it may be identified that the inserted card is a SIM card or a memory card.

A person skilled in the art should understand that some various embodiments may be provided as a method, a system, or a computer program product. Therefore, this application may use a form of hardware only embodiments, software only embodiments, or embodiments with a combination of software and hardware. Moreover, this application may use a form of a computer program product that is implemented on one or more computer-usable storage media (including but not limited to a magnetic disk memory, a CD-ROM, an optical memory, and the like) that include computer-usable program code.

This application is described with reference to the flowcharts and/or the block diagrams of the method, the device (system), and the computer program product according to some various embodiments. It should be understood that computer program instructions may be used to implement each process and/or each block in the flowcharts and/or the block diagrams and a combination of a process and/or a block in the flowcharts and/or the block diagrams. These computer program instructions may be provided for a general-purpose computer, a dedicated computer, an embedded processor, or a processing module of another programmable data processing device to generate a machine, so that the instructions executed by the computer or the processing module of the another programmable data processing device generate an apparatus for implementing a function in one or more processes in the flowcharts and/or in one or more blocks in the block diagrams.

These computer program instructions may be stored in a computer readable memory that can instruct the computer or the another programmable data processing device to work in a manner, so that the instructions stored in the computer readable memory generate an artifact that includes an instruction apparatus. The instruction apparatus implements a function in one or more processes in the flowcharts and/or in one or more blocks in the block diagrams.

These computer program instructions may be loaded onto the computer or another programmable data processing device, so that a series of operations and steps are performed on the computer or the another programmable device, thereby generating computer-implemented processing. Therefore, the instructions executed on the computer or the another programmable device provide steps for implementing a function in one or more processes in the flowcharts and/or in one or more blocks in the block diagrams.

Obviously, a person skilled in the art can make various modifications and variations to some various embodiments without departing from the spirit and scope of some various embodiments. This application is intended to cover these modifications and variations provided that they fall within the scope of protection defined by the following claims and their equivalent technologies.

What is claimed is:

1. An electronic device, comprising a card interface, wherein
    the card interface comprises eight metal springs, the eight metal springs comprising a first metal spring, a second metal spring, a third metal spring, a fourth metal spring, a fifth metal spring, a sixth metal spring, a seventh metal spring, and an eighth metal spring, wherein the first metal spring is adjacent to the second metal spring, and the third metal spring is adjacent to the fourth metal spring;
    when a memory card, comprising eight metal pins, is inserted into the card interface, the eight metal springs are respectively electrically connected to the eight metal pins of the memory card, wherein the eight metal pins of the memory card comprises at least two data metal pins configured to transmit data signal, wherein one of the at least two data metal pins is electrically connected to the first metal spring, and another one of the at least two data metal pins is electrically connected to the fourth metal spring, and the second metal spring is electrically connected to a power supply, and the third metal spring is for grounding; and
    when a subscriber identification module (SIM) card, comprising six metal pins, is inserted into the card interface, the six metal pins are connected to the eight metal springs, wherein a first metal pin of the SIM card is electrically connected to the first metal spring and the second metal spring, and a second metal pin of the SIM card is electrically connected to the third metal spring and the fourth metal spring.

2. The electronic device of claim 1, wherein the first metal spring and the second metal spring are electrically connected to a power supply when the SIM card is inserted into the card interface, the third metal spring and the fourth metal spring are for grounding when the SIM card is inserted into the card interface.

3. The electronic device of claim 1, further comprising a switch, a storage interface and a SIM interface, wherein
    when the SIM card is inserted into the card interface, the card interface is connected a with the SIM interface through the switch; and
    when the memory card is inserted into the card interface, the card interface is connected with the storage interface through the switch.

4. The electronic device of claim 1, further comprising a processor configured to determine whether a card is inserted into the card interface.

5. The electronic device of claim 1, further comprising a processor configured to:
    in response to determination that a card is inserted into the card interface, perform a first initialization operation; and
    determine that the card inserted into the card interface is the SIM card when the first initialization operation succeeds.

6. The electronic device of claim 1, further comprising a processor configured to:
    in response to determination that a card is inserted into the card interface, perform a first initialization operation;
    perform a second initialization operation when the first initialization operation fails; and
    determine that the card inserted into the card interface is the memory card when the second initialization operation succeeds.

7. The electronic device of claim 1, further comprising a processor configured to:
    in response to determination that a card is inserted into the card interface, perform a first initialization operation;
    perform a second initialization operation when the first initialization operation fails; and
    determine that the card inserted into the card interface is invalid when the second initialization operation fails.

8. The electronic device of claim 3, wherein:
    when the SIM card is inserted into the card interface, the sixth metal spring is configured to transmit data of the SIM interface, the seventh metal spring is configured to transmit a reset signal of the SIM interface, and the eighth metal spring is configured to transmit a clock signal of the SIM interface; and
    when the memory card is inserted into the card interface, the sixth metal spring and the seventh metal spring are both configured to transmit data, and the eighth metal spring is configured to transmit a clock signal.

9. The electronic device of claim 1, wherein the second metal spring is electrically connected to a power supply, and the electronic device is configured to:
    determine that the card inserted into the card interface is a SIM card when a voltage level of the first metal spring is a high level; and
    determine that the card inserted into the card interface is a memory card when a voltage level of the first metal spring is a low level.

10. The electronic device of claim 1, wherein the fourth metal spring is for grounding, and the electronic device further comprises a processor configured to:

determine that the card inserted into the card interface is a SIM card when a voltage level of the third metal spring is a low level; and determine the card inserted into the card interface is a memory card when a voltage level of the third metal spring is a high level.

11. The electronic device of claim 1, wherein the fourth metal spring is adjacent to the fifth metal spring, the fourth metal spring is located between the third metal spring and the fifth metal spring; and when a card is inserted into the card interface and the card is a memory card, the fourth metal spring is determined to be short circuited with the fifth metal spring when a voltage level of the third metal spring is a low level.

12. An electronic device, comprising a card interface, wherein the card interface comprises at least a first metal spring, a second metal spring, a third metal spring and a fourth metal spring, wherein the first metal spring is adjacent to the second metal spring, and the third metal spring is adjacent to the fourth metal spring;

when a memory card, comprising at least two data metal pins configured to transmit data signal, is inserted into the card interface, one of the at least two data metal pins is electrically connected to the first metal spring, and another one of the at least two data metal pins is electrically connected to the fourth metal spring, the second metal spring is electrically connected to a power supply, and the third metal spring is for grounding; and when a subscriber identification module (SIM) card is inserted into the card interface, a first metal pin of the SIM card is electrically connected to the first metal spring and the second metal spring, and a second metal pin of the SIM card is electrically connected to the third metal spring and the fourth metal spring.

13. The electronic device of claim 12, wherein the first metal spring and the second metal spring are electrically connected to a power supply when the SIM card is inserted into the card interface, the third metal spring and the fourth metal spring are for grounding when the SIM card is inserted into the card interface.

14. The electronic device of claim 12, further comprising a switch, a storage interface and a SIM interface, wherein when the SIM card is inserted into the card interface, the card interface is connected with the SIM interface through the switch; and when the memory card is inserted into the card interface, the card interface is connected with the storage interface through the switch.

15. The electronic device of claim 12, further comprising a processor configured to determine whether a card is inserted into the card interface.

16. The electronic device of claim 12, further comprising a processor configured to:

in response to determination that a card is inserted into the card interface, perform a first initialization operation; and determine that the card inserted into the card interface is the SIM card when the first initialization operation succeeds.

17. The electronic device of claim 12, further comprising a processor configured to:

in response to determination that a card is inserted into the card interface, perform a first initialization operation;

perform a second initialization operation when the first initialization operation fails; and determine that the card inserted into the card interface is the memory card when the second initialization operation succeeds.

18. The electronic device of claim 12, further comprising a processor configured to:

in response to determination that a card is inserted into the card interface, perform a first initialization operation;

perform a second initialization operation when the first initialization operation fails; and determine that the card inserted into the card interface is invalid when the second initialization operation fails.

19. The electronic device of claim 14, wherein the card interface further comprises a sixth metal spring, a seventh metal spring and an eighth metal spring:

when the SIM card is inserted into the card interface, the sixth metal spring is configured to transmit data of the SIM interface, the seventh metal spring is configured to transmit a reset signal of the SIM interface, and the eighth metal spring is configured to transmit a clock signal of the SIM interface; and when the memory card is inserted into the card interface, the sixth metal spring and the seventh metal spring are both configured to transmit data, and the eighth metal spring is configured to transmit a clock signal.

20. The electronic device of claim 12, wherein the second metal spring is electrically connected to a power supply, and the electronic device is configured to:

determine that the card inserted into the card interface is a SIM card when a voltage level of the first metal spring is a high level; and determine that the card inserted into the card interface is a memory card when a voltage level of the first metal spring is a low level.

* * * * *

UNITED STATES PATENT AND TRADEMARK OFFICE
CERTIFICATE OF CORRECTION

PATENT NO. : 11,704,508 B2  
APPLICATION NO. : 17/876743  
DATED : July 18, 2023  
INVENTOR(S) : Jiangtao Yang Page 1 of 1

It is certified that error appears in the above-identified patent and that said Letters Patent is hereby corrected as shown below:

In the Specification

Column 16, Line 7, change "DO" to "D0"; and

Column 16, Line 10, change both instances of "DO" to "D0".

Signed and Sealed this  
Fifteenth Day of August, 2023

Katherine Kelly Vidal  
*Director of the United States Patent and Trademark Office*